(12) United States Patent
Lee et al.

(10) Patent No.: US 7,511,302 B2
(45) Date of Patent: Mar. 31, 2009

(54) TFT ARRAY PANEL

(75) Inventors: Je-Hun Lee, Seoul (KR); Jae-Kyeong Lee, Yongin-si (KR); Chang-Oh Jeong, Suwon-si (KR); Beom-Seok Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 131 days.

(21) Appl. No.: 11/049,742

(22) Filed: Feb. 4, 2005

(65) Prior Publication Data

US 2005/0285251 A1 Dec. 29, 2005

(30) Foreign Application Priority Data

Feb. 5, 2004 (KR) .................. 10-2004-0007678

(51) Int. Cl.
*H01L 27/14* (2006.01)
(52) U.S. Cl. .................. 257/72; 257/763; 257/764; 257/E27.116
(58) Field of Classification Search .............. 257/764, 257/763, E23.179, 72
See application file for complete search history.

(56) References Cited

U.S. PATENT DOCUMENTS 6,255,706 B1 * 7/2001 Watanabe et al. .......... 257/412
7,029,727 B1 * 4/2006 Kokura et al. ............. 428/1.1
2003/0168968 A1 * 9/2003 Sotani et al. .............. 313/498
2003/0184687 A1 * 10/2003 Matsubara ................. 349/43

FOREIGN PATENT DOCUMENTS

CN 1276622 12/2000

OTHER PUBLICATIONS

S. Kacim,"Structural behavior of direct-current sputtered and thermally evaporated molybdenum thin films", 1994, Thin Solid Films, 249, pp. 150-154.*
Chinese Patent Application No. 20051006727 Office Action dated Feb. 9, 2007; with English Abstract; 7 pages.

* cited by examiner

*Primary Examiner*—Jerome Jackson, Jr.
*Assistant Examiner*—Paul A Budd
(74) *Attorney, Agent, or Firm*—Cantor Colburn LLP

(57) ABSTRACT

Multi-layered wiring for a larger flat panel display is formed by depositing molybdenum on a substrate in presence of a precursor gas containing at least one oxygen, nitrogen and carbon to form a molybdenum layer. An aluminum layer is deposited on the molybdenum layer. Another metal layer may be formed on the aluminum layer. The molybdenum layer has a face-centered cubic (FCC) lattice structure with a preferred orientation of (111).

3 Claims, 28 Drawing Sheets

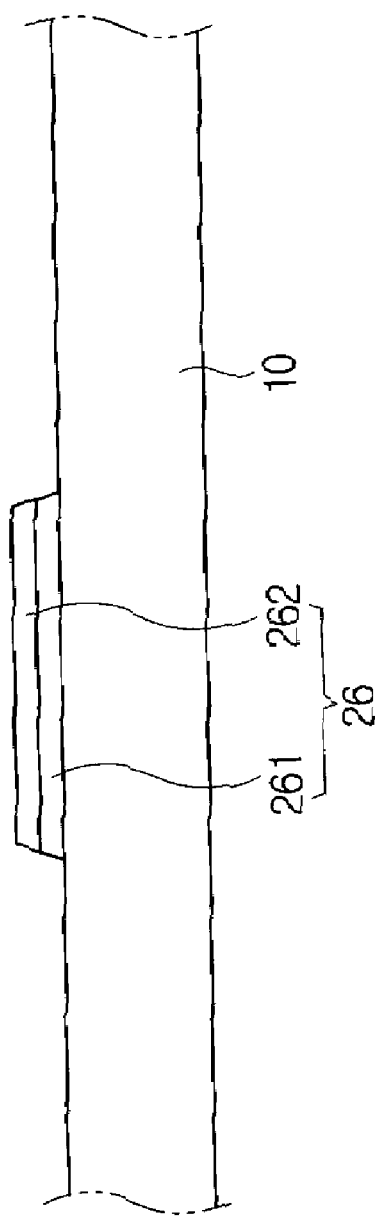

TFT ARRAY PANEL

CROSS-REFERENCE TO RELATED APPLICATIONS

This application claims the benefit of Korean Patent Application No. 2004-007678, filed on Feb. 5, 2004, in the Korean Intellectual Property Office, the disclosure of which is incorporated herein by reference.

BACKGROUND OF THE INVENTION

1. Field of the Invention

The present invention relates to a TFT (thin film transistor) array panel using aluminum wiring.

2. Description of the Related Art

A larger screen liquid crystal display (LCD) (e.g., widescreened high definition LCD) requires longer and narrower wiring. High resistance wiring materials may cause RC delay and degrading a picture quality. Wiring materials having relatively high melting points (e.g., tantalum, chrome, titanium, or an alloy thereof) are no longer suitable for a large screen LCD because of their high resistance values. Wiring materials having relatively low resistances are silver, copper, aluminum, etc. Silver and copper are not suitable wiring materials because of poor adhesion with amorphous silicon.

Due to the drawbacks of other wiring materials, aluminum is a more suitable wiring material for a large screen LCD. However, aluminum is susceptible to a hillock problem. FIG. 1 shows a hillock 2100 protruding from an aluminum line 2000 and damaging an insulating layer 3000 (e.g., $SiN_x$). The hillock 2100 includes a thin and long whisker 2110. An active layer 4000 (e.g., amorphous silicon) formed on the insulating layer 3000 is also damaged. The hillock 2100 may cause short-circuit between the aluminum line 2000 and the active layer 4000 or between the neighboring aluminum wiring lines 2000. Also, the hillock 2100 may cause a TFT to be defective. Thus, there is a need for improving wiring for a larger LCD.

SUMMARY OF THE INVENTION

The present invention provides a method for fabricating a thin film transistor (TFT) array panel. A molybdenum layer is deposited on a substrate in presence of a precursor gas containing at least one of oxygen, nitrogen and carbon. An aluminum layer is deposited on the molybdenum layer.

An aspect of the present invention is a thin film transistor (TFT) array panel having a molybdenum layer formed on a substrate. The molybdenum contains at least one of oxygen, nitrogen and carbon. An aluminum layer is formed on the molybdenum layer.

Another aspect of the present invention is a thin film transistor (TFT) array panel having a molybdenum layer formed on a substrate. The molybdenum layer has a face-centered cubic (FCC) lattice structure and having an orientation of (111). An aluminum layer formed on the molybdenum layer.

According to an aspect of the invention, the molybdenum layer is formed by sputtering, in which a precursor gas containing impurity is introduced into a sputtering chamber. Alternatively, the molybdenum layer is formed by evaporation, in which a precursor gas containing the impurity is introduced into an evaporation chamber. The precursor gas comprises at least one selected from a group consisting of nitrogen gas, oxygen gas, air, carbon dioxide, carbon oxide, methane and ammonia.

According to an aspect of the invention, the molybdenum layer contains the impurity by 0.01 to 30 atom %. When the impurity content is lower than 0.01 atom %, the molybdenum layer's lattice structure is not changed. When the impurity content is higher than 30 atom %, the molybdenum layer may lose its property. A metal layer may be deposited on the aluminum layer to form a triple-layered structure. Particularly, a pure molybdenum layer may be deposited on the aluminum layer.

Another aspect of the present invention is a thin film transistor array panel having a molybdenum layer formed on a substrate and containing at least one impurity selected from a group of consisting of oxygen, nitrogen and carbon. An aluminum layer is formed on the molybdenum layer. The molybdenum layer contains the impurities and hence the structure of the molybdenum layer is changed from a body centered cubic (BCC) structure into a face-centered cubic (FCC) structure with a preferred orientation of (111). The aluminum layer has a preferred orientation of (111) due to the influence from the underlying molybdenum layer. The molybdenum layer preferably contains the impurity by 0.01 to 30 atom %. A metal layer may be deposited on the aluminum layer to form a triple-layered structure. Particularly a pure molybdenum layer may deposited on the aluminum layer.

Another aspect of the present invention is a TFT array panel comprising a molybdenum layer formed on a substrate with an FCC structure and a preferred orientation of (111). An aluminum layer formed is on the molybdenum layer. The aluminum layer has a preferred orientation of (111) due to the influence from the underlying molybdenum layer.

In this specification, the preferred orientation of (111) means that the ratio of (111) peak intensity (I) to (hkl) intensity, that is $I(111)/\Sigma I(hkl)$, is over 80% by X-ray diffraction (XRD) and ω, the width of (111) intensity by pole figure with goniometer, is smaller than 10 degree. Aluminum has a FCC structure and has various crystal directions such as (100), (110) and (111). The aluminum grains for aluminum wiring also has various crystal directions, thus the structure of the aluminum grains is not dense and unstable. The hillock property of aluminum heavily depends on crystal directions. It is known that when aluminum grains have a preferred orientation of (111) or are deposited with crystal direction of (111), aluminum wiring formed thereof exhibits good anti-hillock property.

However, a preferred orientation of aluminum has close relation with a crystal structure of the underlying layer, which can be found in J. Appl. Phys. 77(8) Apr. 15, 1999, pp 3799-3804. Aluminum may have a preferred orientation of (111) when the underlying layer has the FCC structure and a preferred orientation of (111). For example, by depositing aluminum on the nickel layer having a FCC structure with a preferred orientation of (111), an aluminum layer with a preferred orientation of (111) can be obtained. This is because when aluminum is deposited on the underlying layer with a preferred orientation of (111), the aluminum layer tends to have a preferred orientation of (111) to reduce interfacial energy and to make nucleation easy. By the way, when the underlying layer is formed with chrome or vanadium with a BCC structure and a preferred orientation of (110), the aluminum layer may show a poor preferred orientation of (111). Thus, by depositing an aluminum layer on a layer having a FCC structure with the preferred orientation of (111), an aluminum layer having a preferred orientation of (111) can be obtained.

Molybdenum having a BBC structure is used as the underlying layer in the present invention. However, the molybdenum structure can be changed depending on deposition conditions, as described in Thin Solid Films, 249(1994), pp 150-154. More specifically, molybdenum with a BCC structure may be changed into a FCC structure with a preferred orientation of (111) by solid solution containing impurity such as oxygen, carbon, and nitrogen. That is, the impurity in form of the solid solution changes the molybdenum from a BCC structure into a FCC structure. Moreover, the lattice parameter of molybdenum with impurity is about 4.14~4.22, which is similar to that of aluminum 4.05. The similar lattice parameter is favorable to maximize the preferred orientation of (111) for aluminum.

Hereafter, the method for forming a molybdenum layer containing impurity and depositing the aluminum layer on the molybdenum layer will be described. The wiring comprises a gate line and a data line, wherein the data line comprises a source electrode and a drain electrode. The data lines may be formed over another wiring lines.

Sputtering and evaporation methods are used to form a metal layer on the substrate. In sputtering method, argon gas is injected into a chamber loaded with a target electrode formed of metal, and then plasma discharge is performed by subjecting the target electrode to a high voltage. Excited argon cations formed by the plasma discharge detach metal atoms from the target electrode, and then the detached metal atoms grow into a thin film on the substrate.

In sputtering method for making a molybdenum layer containing impurity, the target electrode is formed of molybdenum, and a precursor of the impurity is injected into a sputtering chamber. Oxygen gas, carbon monoxide or carbon dioxide may be used as a precursor of oxygen. Nitrogen gas or ammonia may be used as a precursor of nitrogen. Methane, carbon monoxide or carbon dioxide may be used as a precursor of carbon.

In an evaporation method, molybdenum is heated by an electron beam. Molybdenum atoms are emitted from the heated molybdenum, and the emitted molybdenum atoms are deposited on the substrate. In the evaporation method for making a molybdenum layer containing impurity, a precursor of the impurity is injected into the evaporation chamber. Oxygen gas, carbon monoxide or carbon dioxide may be used as an oxygen precursor. Nitrogen gas or ammonia may be used as a nitrogen precursor. Methane, carbon monoxide or carbon dioxide may be used as a carbon precursor. The concentration of the precursor in the chamber may be controlled in consideration of a deposition temperature, time, and a desired content of impurity.

Solid solution of oxygen, nitrogen or carbon in molybdenum transforms molybdenum from a BCC to a FCC structure with a preferred orientation of (111). The molybdenum layer contains the impurity by 0.01 to 30 atom %. If the content of impurity is lower than 0.01 atom %, the structural change in molybdenum is insufficient. When the content of impurity is higher than 30 atom %, molybdenum may lose its characteristic, that is, molybdenum is changed into alloy-like form, which is neither a FCC structure nor a BCC structure.

Subsequently, an aluminum layer is formed on the molybdenum layer. Sputtering and evaporation methods are also used to form the aluminum layer. Upon depositing on the molybdenum layer having a preferred orientation of (111), the aluminum layer tends to have a preferred orientation of (111) for low interfacial energy. Further, the preferred orientation of (111) in the aluminum layer is maximized by a similar lattice constant between molybdenum and aluminum. Accordingly, the aluminum layer having a preferred orientation(111) having good anti-hillock property is achieved. Thereafter, an insulating layer is formed on the aluminum layer. A photolithography process is performed to pattern the aluminum wiring.

BRIEF DESCRIPTION OF THE DRAWINGS

The above and/or other aspects and advantages of the present invention will become apparent and more readily appreciated from the following description of the embodiments, taken in conjunction with the accompany drawings.

FIGS. 13A, 13B, 14A, 14B, 15A, 15B, 16A, 16B, 17A, 17B, 18A, 18B, 19A, 19B, 20A and 20B are sectional views showing a process of fabricating the TFT array panel according to the second embodiment of the present invention.

DETAILED DESCRIPTION OF PREFERRED EMBODIMENTS

Figure 1:
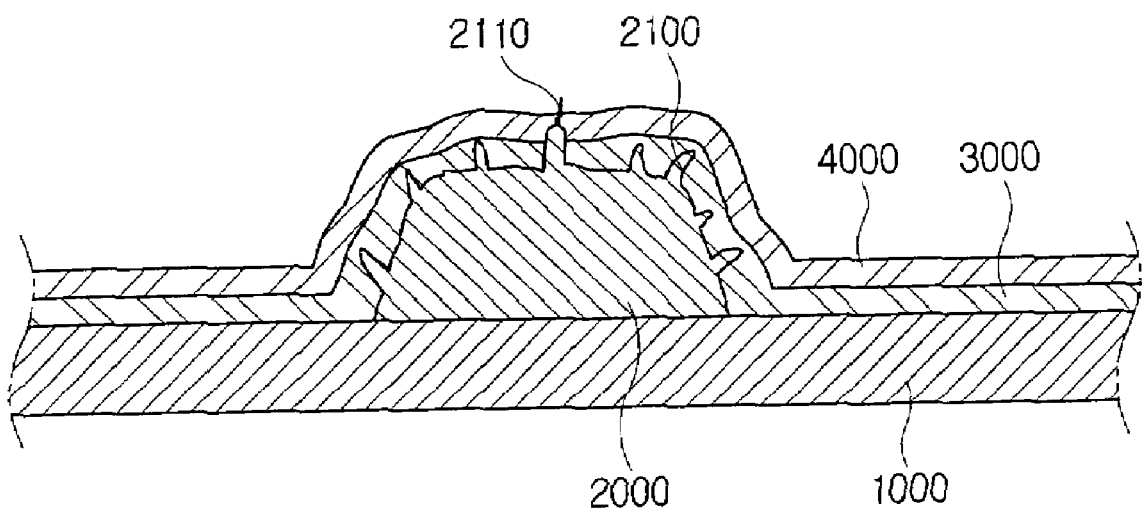
FIG. 1 is a cross sectional view showing a hillock in a conventional method of forming aluminum wiring lines.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 2:
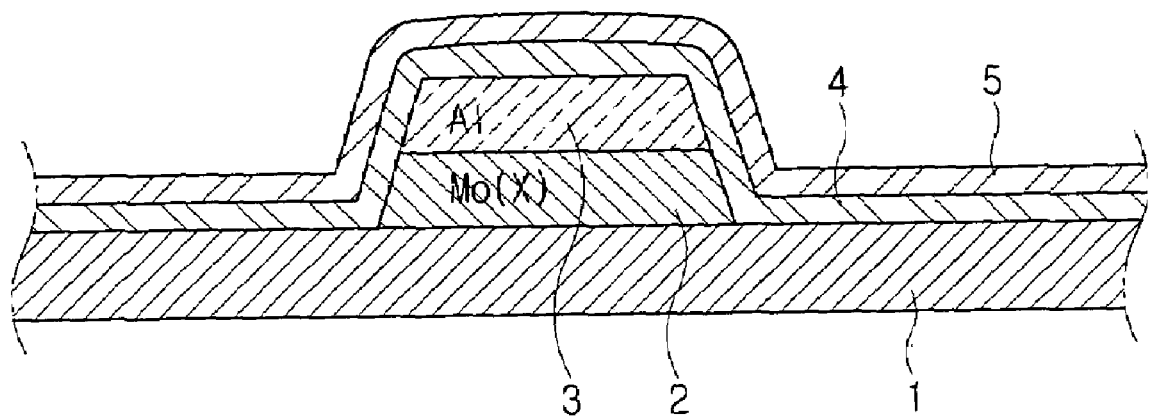
FIG. 2 is a cross-sectional view showing aluminum wiring lines according to the first embodiment of the present invention.

FIG. 2 is a cross sectional view showing aluminum wiring lines according to the first embodiment of the present invention. In FIG. 2, a metal layer is etched into a wiring line, and an insulating layer and an active layer are formed on the wiring line in sequence. That is, a molybdenum layer 2 is formed on a substrate 1. Here, the molybdenum layer 2 contains impurities such as oxygen, nitrogen, carbon or the like, which is referred to as Mo(X) (i.e., X indicates the impurities). Preferably, the molybdenum layer 2 contains the impurities by 0.01 to 30 atom %. The molybdenum including the impurities has a FCC structure and a preferred orientation of (111).

On the molybdenum layer 2 is formed an aluminum layer 3. The aluminum layer 3 has a preferred orientation of (111) due to the influence from the underlying molybdenum layer 2. The molybdenum layer 2 and the aluminum layer 3 are covered with an insulating layer 4. Further, an active layer 5 is formed on the insulating layer 4. Generally, the insulating layer 4 is formed of SiNx, and the active layer 5 is formed of amorphous silicon.

Figure 3:
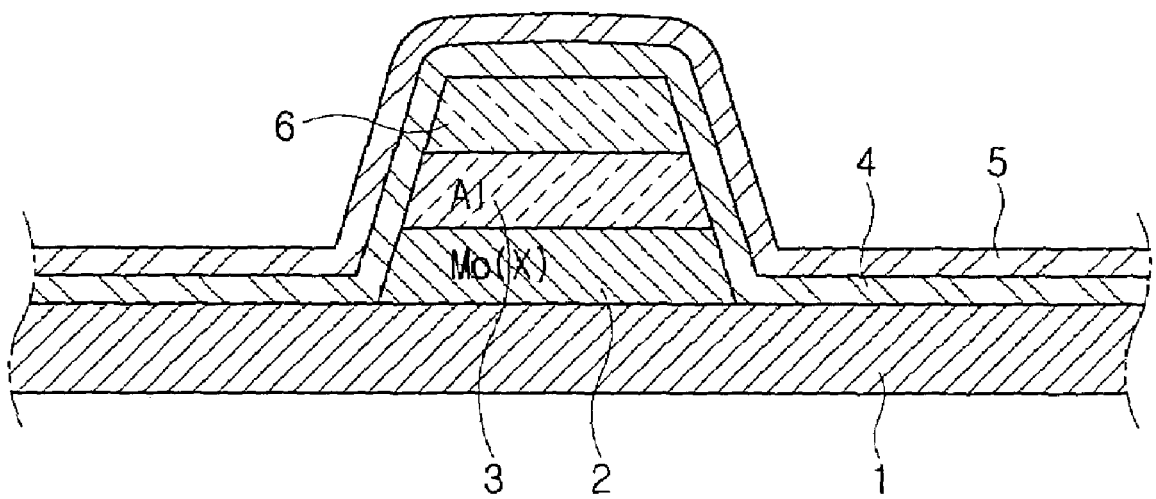
FIG. 3 is a cross-sectional view showing an aluminum wiring line according to the second embodiment of the present invention.

FIG. 3 is a-cross sectional view showing an aluminum wiring line according to the second embodiment of the present invention, in which the aluminum wiring line further comprises a metal layer 6 such as a pure molybdenum layer, which is formed on the aluminum layer 3. Alternatively, utilizing the molybdenum layer with the preferred orientation of (111) as an underlying layer is applicable to another metal such as copper, nickel or silver, which have FCC structure. Hereinbelow, a TFT array panel according to an embodiment of the present invention, and a method of fabricating the same will be described.

Figure 4:
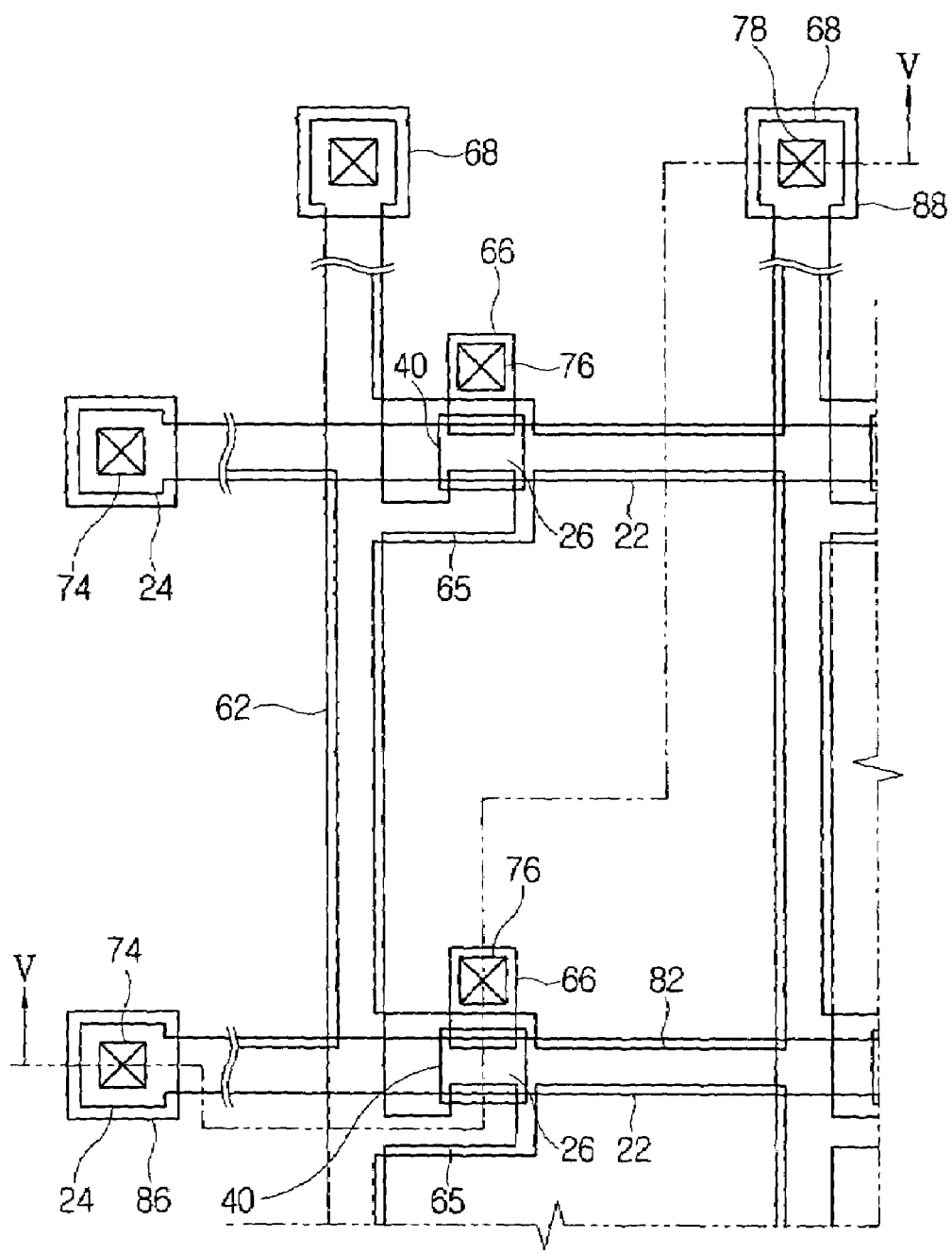
FIG. 4 is a plan view of a TFT array panel according to the first embodiment of the present invention.
Figure 5:
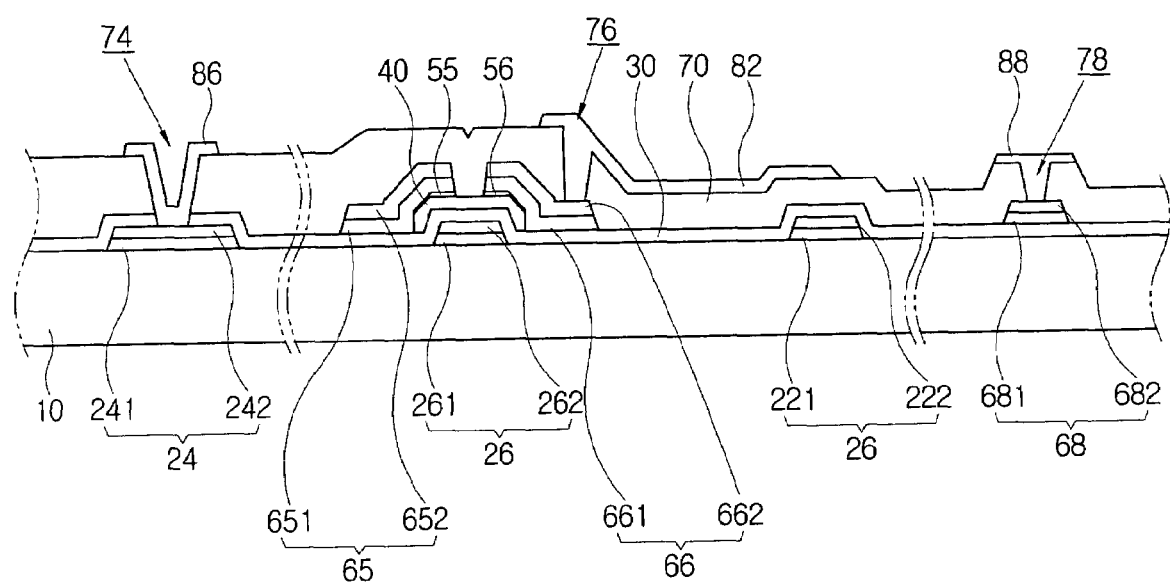
FIG. 5 is a cross-sectional view of the TFT array panel, taken along line V-V' of FIG. 4.

FIG. 4 is a plan view of a TFT array panel according to the first embodiment of the present invention. FIG. 5 is a cross-sectional view of the TFT array panel, taken along line V-V' of FIG. 4. FIGS. 6 through 9 are sectional-views showing a process of fabricating the TFT array panel according to the first embodiment of the present invention.

On the substrate 10 is formed a double-layered gate line assembly 22, 24, 26 comprising a first gate metal layer 221, 241, 261 and a second gate metal layer 222, 242, 262, wherein the first gate metal layer 221, 241, 261 is a molybdenum layer containing at least one of oxygen, nitrogen and carbon, and the second gate metal layer 222, 242, 262 is an aluminum layer.

The gate line assembly 22 and 26 includes a gate line 22 formed in a horizontal direction, and a gate electrode 26 included in a thin film transistor and connected to the gate line 22, wherein the width of one end portion 24 of the gate line 22 is enlarged to form electrical contact with an external circuit. Further, on the first substrate 10 is formed a gate insulating layer 30 formed of silicon nitride (SiNx) or the like, and covering the gate line assembly 22, 24, 26. On the gate insulating layer 30 of the gate electrodes 26 is formed a semiconductor layer 40 formed of amorphous silicon or the like. On the semiconductor layer 40 are formed ohmic contact layers 55 and 56 formed of n+ hydrogenated amorphous silicon, which is highly-doped with n-type impurities.

On the ohmic contact layers 55 and 56 and the gate insulating layer 30 is formed a double-layered data line assembly 65, 66, 68, wherein the data line assembly 65, 66, 68 comprises a first data metal layer 651, 661, 681 and a second gate metal layer 652, 662, 682. Here, the first data metal layer 651, 661 and 681 is a molybdenum layer containing at least one of oxygen, nitrogen and carbon, and the second data metal layer 652, 662, 682 is an aluminum layer. Likewise, a data line 62 has the same structure of the molybdenum layer containing at least one of oxygen, nitrogen and carbon, and the aluminum layer, which is not shown.

The data line assembly 62, 65, 66, 68 comprises a data line 62 formed in a vertical direction and crossing the gate line 22 to define a pixel, a source electrode 65 branched from the data line 62 and extended over the ohmic contact layer 55, and a drain electrode 66 separated from the source electrode 55 and formed over the ohmic contact layer 56 while being opposite to the source electrode 65 across the gate electrode 26, wherein the width of one end 68 of the data line 62 is enlarged to form electrical contact with the external circuit.

A protective layer 70 is formed on the data line assembly 62, 65, 66, 68 and a portion of the semiconductor layer 40 which is not covered with the data line assembly 62, 65, 66, 68, wherein the protective layer 70 is formed of a SiNx layer, an a-Si:C:O layer, a-Si:O:F (low dielectric CVD layer), an acryl-based organic insulating layer, or etc. The a-Si:C:O layer and the a-Si:O:F layer are formed through PECVD (plasma enhanced chemical vapor deposition), and has a low dielectric constant of 4 or below (i.e., the dielectric constant thereof ranges from 2 to 4). Thus, a parasitic capacitance problem does not arise in the a-Si:C:O or a-Si:O:F layer even though its thickness is relatively small. Further, the a-Si:C:O and a-Si:O:F layers are excellent in step coverage and show good contact property with other layers. Also, each of the a-Si:C:O and a-Si:O:F layers is an inorganic CVD layer and therefore has good heat-resistance property as compared with an organic dielectric layer. Besides, a deposition rate and an etching rate of the a-Si:C:O layer and the a-Si:O:F layer are four through ten times higher than those of SiNx, so that the a-Si:C:O layer and the a-Si:O:F layer decreases the process time.

The protective layer 70 has a contact hole 76 exposing the drain electrode 66, a contact hole 78 exposing an end portion 68 of the data line, and a contact hole 74 exposing an end portion 24 of the gate line and the gate insulating layer 30. On the protective layer 70 is formed a pixel electrode 82 electrically connected to the drain electrode 66 through the contact hole 76 and located on a pixel region. Further, on the protective layer 70 are formed contact subsidiary parts 86, 88 connected to the end portion 24 of the gate line and the end portion 68 of the data line through the contact hole 74 and 78, respectively. Here, the pixel electrode 82 and the contact subsidiary parts 86, 88 are formed of ITO (indium tin oxide) or IZO (indium zinc oxide).

Referring to FIGS. 4 and 5, the pixel electrode 82 is overlapped with the gate line 22 to is form a storage capacitor. In case where the capacitance of the storage capacitor is not sufficient, a storage capacitor line assembly may be additionally provided at the same level as the gate line assembly 22, 24, 26. Further, the pixel electrode 82 can be overlapped with the data lines 62 to maximize an aperture ratio. Even though the pixel electrode 82 is overlapped with the data line 62, the parasitic capacitance problem arising between the pixel electrode 82 and the data line 62 can be ignored if the protective layer 70 is formed of the low dielectric CVD layer.

Figure 6:
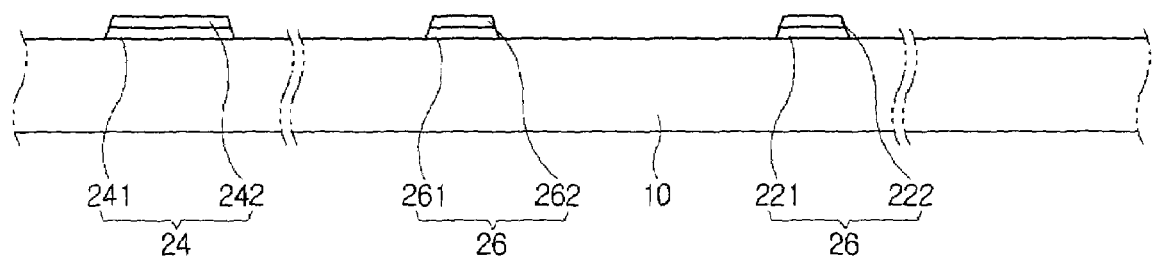
FIGS. 6, 7, 8 and 9 are sectional views showing a process of fabricating the TFT array panel according to the first embodiment of the present invention.

A method of fabricating the TFT array panel according to the first embodiment is as follows. As shown in FIG. 6, the first gate metal layer 221, 241, 261 is deposited on the substrate 10, which is formed of molybdenum containing at least one of oxygen, nitrogen and carbon. Thereafter, the second gate metal layer 222, 242, 262, formed of aluminum, is deposited and then patterned by performing a photolithography process, to form gate line assembly 22, 24, 26. The gate line assembly 22, 24, 26 includes the gate lines 22 and the gate electrodes 26, and extends in a transverse direction.

Figure 7:
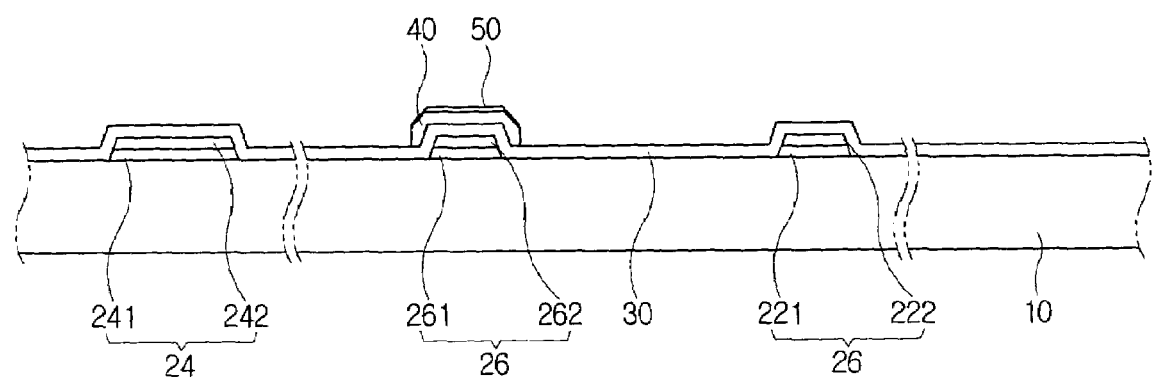

Referring to FIG. 7, the gate insulating layer 30 formed of silicon nitride, the semiconductor layer 40 formed of amorphous silicon, and a doped amorphous silicon layer 50 are sequentially deposited onto the substrate 10. The semiconductor layer 40 and the doped amorphous silicon layer 50 are patterned by performing a photolithography process, thereby forming the semiconductor layer 40 and the ohmic contact layer 50 like an island on the gate insulating layer 30 over the gate electrode 26.

Figure 8:
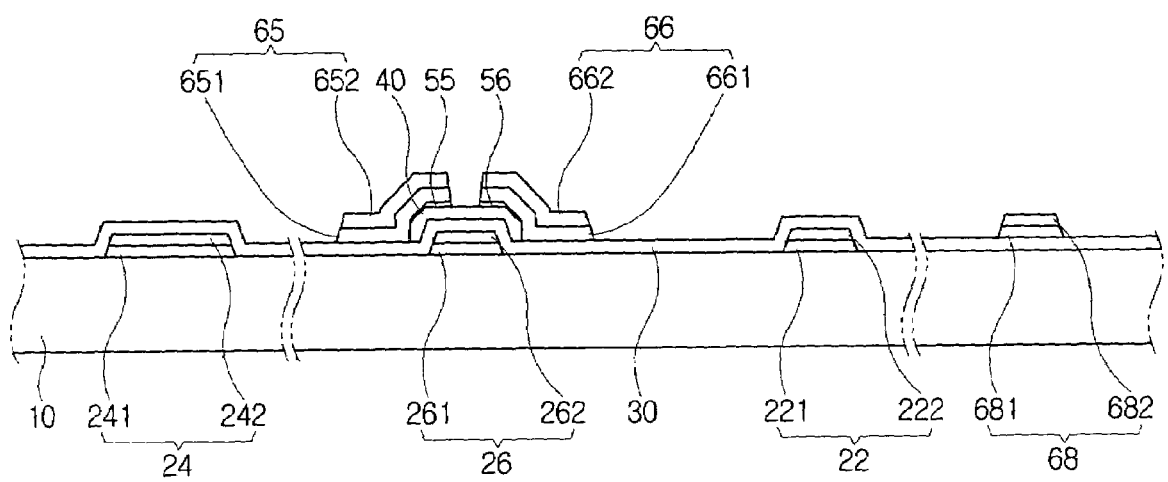

Referring to FIG. 8, the first data metal layer 651, 661, 681 formed of molybdenum containing at least one of oxygen, nitrogen and carbon is deposited on the gate insulating layer 30. Thereafter, the second data metal layer 622, 652, 662, 682 formed of aluminum is deposited and patterned by a photolithography process, to form the data line assembly. The data line assembly comprises the data line 62 crossing the gate line 22, the source electrode 65 connected to the data line 62 and extending over the gate electrode 26, and the drain electrode 66 isolated from the source electrode 65 and opposite to the source electrode 65 across the gate electrode 26.

Subsequently, the doped amorphous silicon layer 50 is etched at a region where the data line assembly 62, 65, 66, 68 is not deposited, thereby being separated with respect to the gate electrode 26 and exposing the semiconductor layer 40 between the opposite doped amorphous silicon layers 50. Additionally, an oxygen plasma pulse can be applied to stabilize the surface of the exposed semiconductor layer 40.

Figure 9:
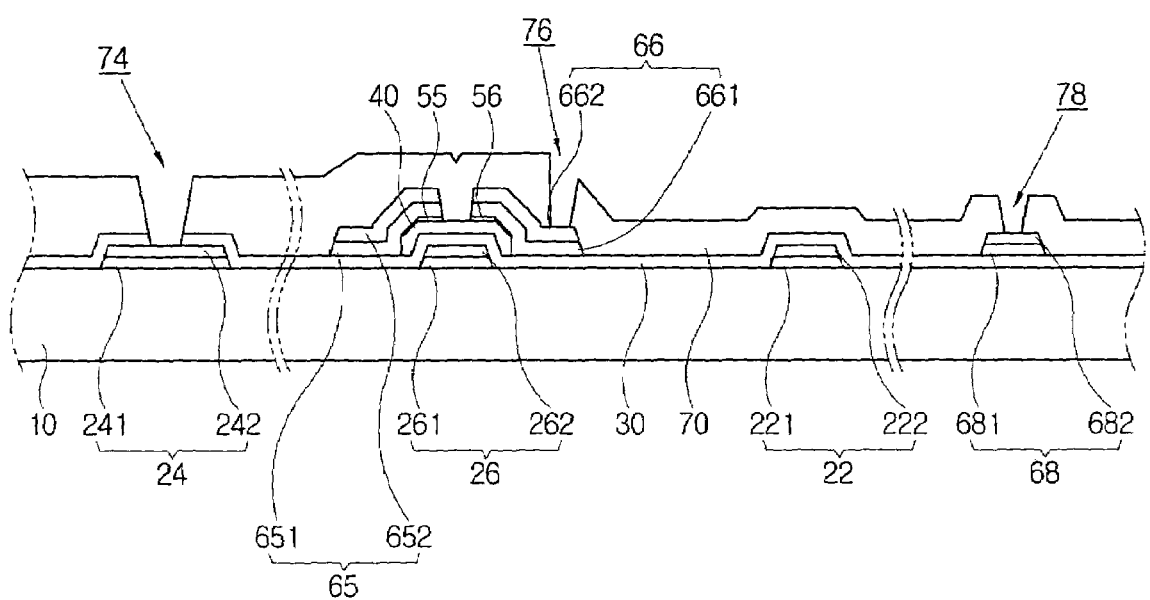

Referring to FIG. 9, the protective layer 70 is formed by growing a silicon nitride layer, an a-Si:C:O layer, or an a-Si:C:F layer through the CVD method, or by coating organic insulating material. Then, the protective layer 70, together with the gate insulating layer 30, is patterned by the photolithography, thereby forming the contact hole 74, 76, 78 through the end portion 24 of the gate line, the drain electrode 66, and the end portion 68 of the data line are exposed respectively.

Referring to FIGS. 4 and 5, the ITO layer or the IZO layer is deposited and etched by performing a photolithography process, thereby forming the pixel electrode 82 electrically connected to the drain electrode 66 through the contact hole 76 and forming the contact subsidiary parts 86, 88 respectively connected to the end portion 24 of the gate line and the end portion 68 of the data line. Preferably, nitrogen gas is used in a pre-heating process before depositing the ITO layer or the IZO layer.

According to the first embodiment of the present invention, both the gate line assembly 22, 24, 26 and the data line assembly 62, 65, 66, 68 have a double-layered structures. Alternatively, either the gate line assembly 22, 24, 26 or the data line assembly 62, 65, 66, 68 may have the double-layered structures, as necessary. Further, one or both of the gate line assembly and the data line assembly may have a triple-layered structure. Furthermore, the present invention is not necessarily limited to both the gate line assembly 22, 24, 26 and the data line assembly 62, 65, 66, 68.

Figure 10:
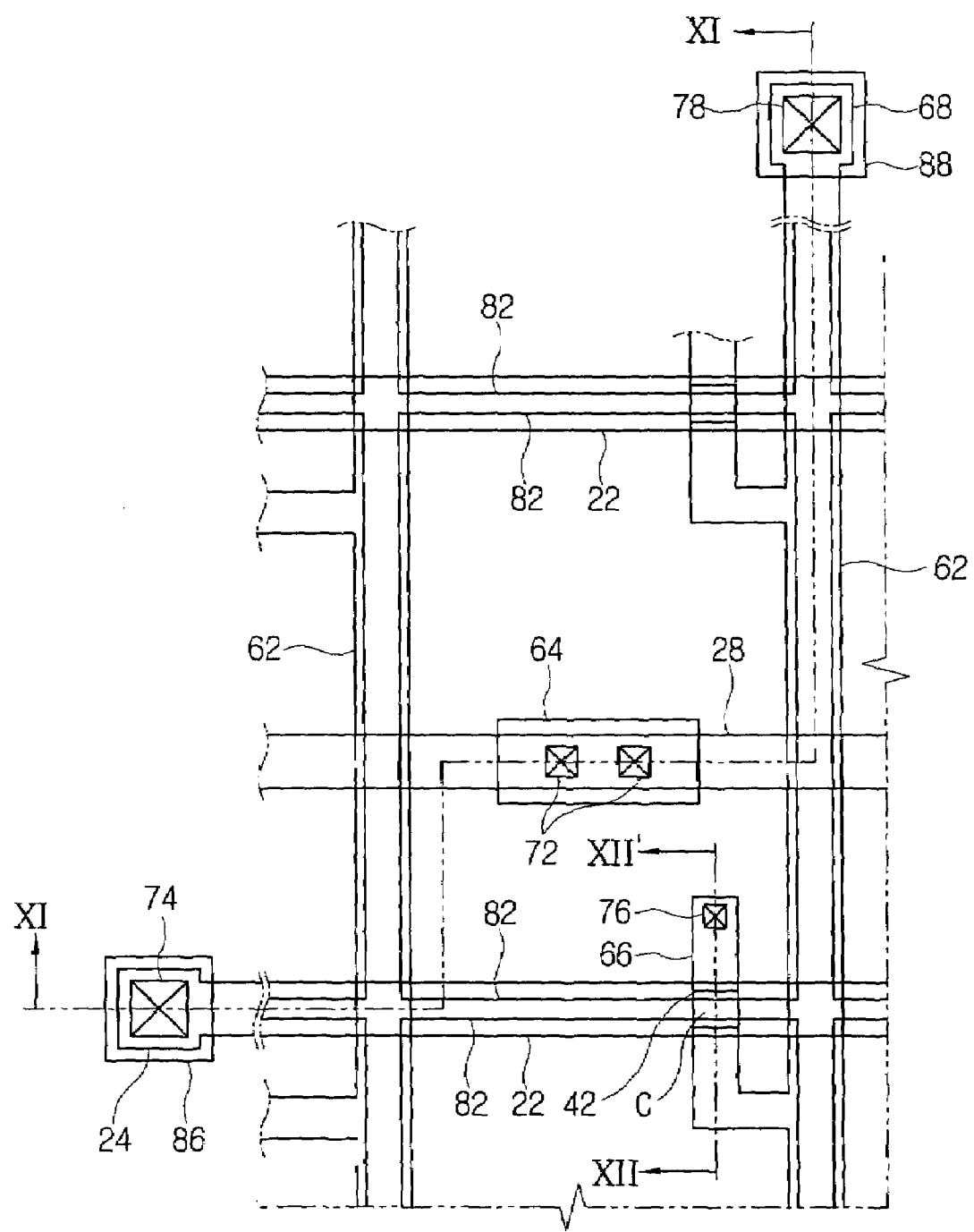
FIG. 10 is a plan view of a TFT array panel according to the second embodiment of the present invention.
Figure 11:
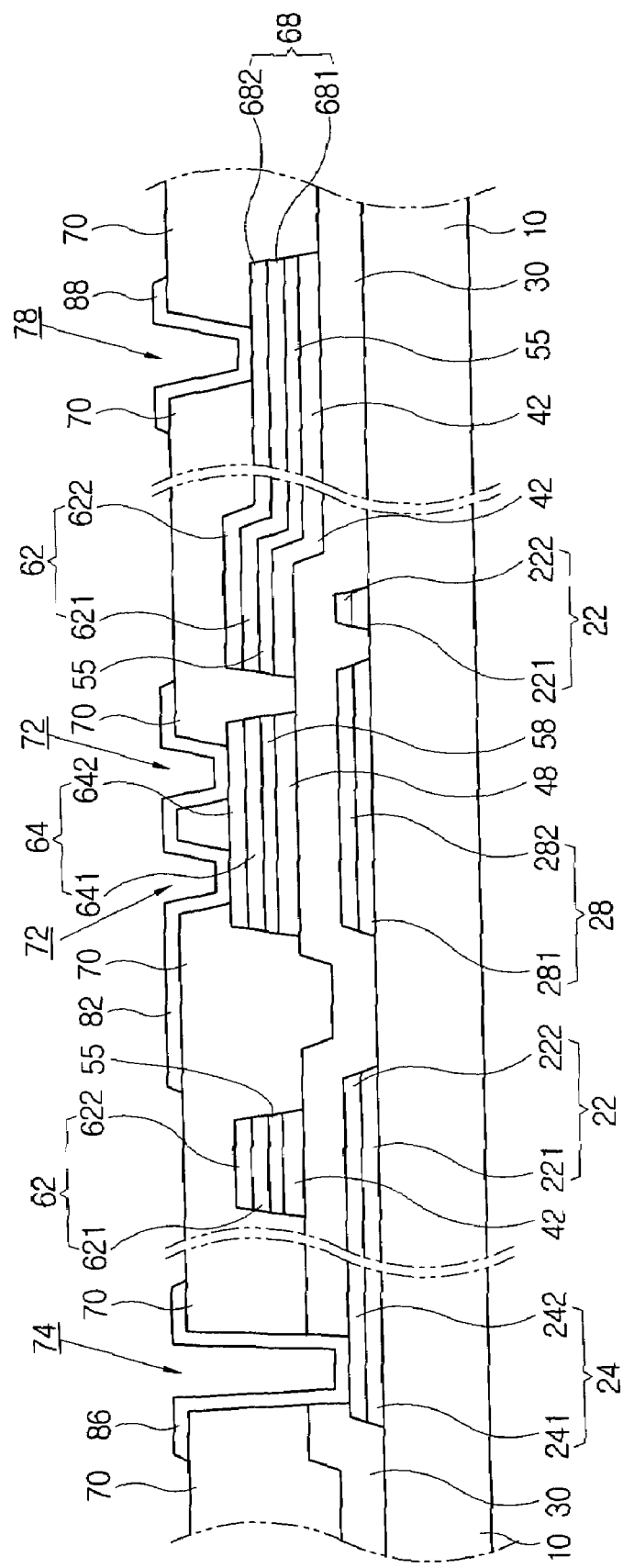
FIG. 11 is a cross-sectional view of the TFT array panel, taken along line XI-XI' of FIG. 10.
Figure 12:
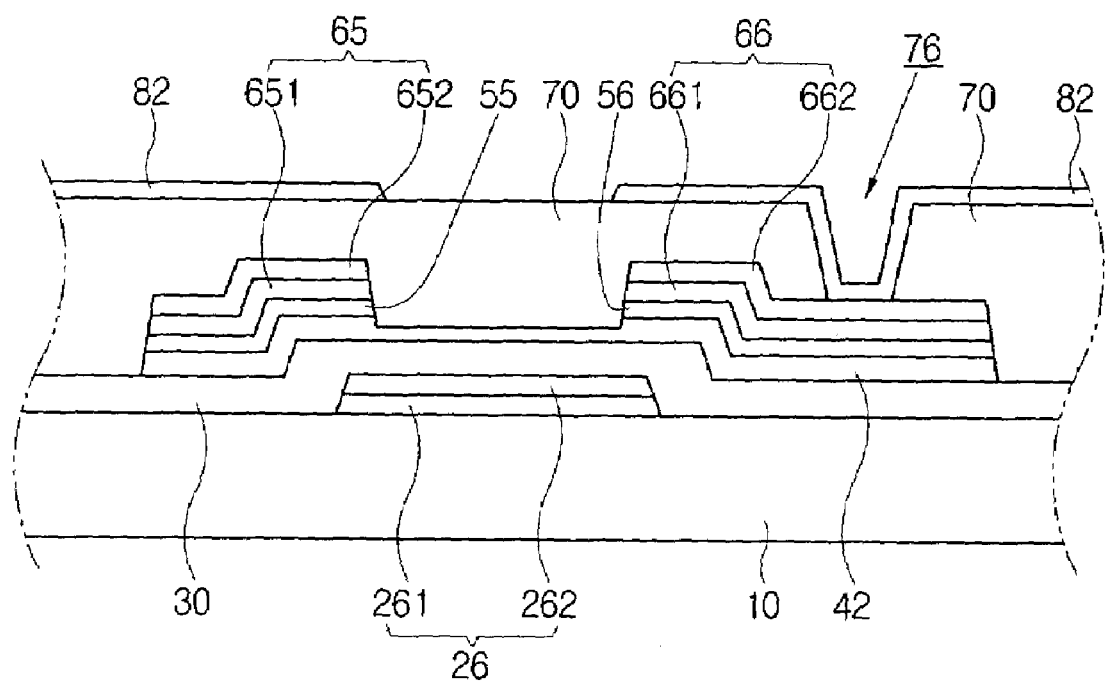
FIG. 12 is a cross-sectional view of the TFT array panel, taken along line XII-XII' of FIG. 10.

The first embodiment employs five masks in fabricating the TFT array panel, but the following second embodiment employs four masks. FIG. 10 is a plan view of a TFT array panel according to a second embodiment of the present invention. FIG. 11 is a cross-sectional view of the TFT array panel, taken along line XI-XI' of FIG. 10. FIG. 12 is a cross sectional view of the TFT array panel, taken along line XII-XII' of FIG. 10. FIGS. 13A, 13B, 14A, 14B, 15A, 15B, 16A, 16B, 17A, 17B, 18A, 18B, 19A, 19B, 20A and 20B are sectional views showing a process of fabricating the TFT array panel according to the second embodiment of the present invention.

Similar to the first embodiment, on a substrate 10 is formed a gate line assembly 22, 24, 26 having a double-layered structure comprising a first gate metal layer 221, 241, 262 and a second gate metal layer 222, 242, 262. The first gate metal layer 221, 241, 262 is formed of molybdenum containing at least one of oxygen, nitrogen and carbon. The second gate metal layer 222, 242, 262 is formed of aluminum.

Further, on the substrate 10 is formed a storage electrode line 28 in parallel with the gate line 22. The storage electrode line 28 has a double-layered structure comprising a first gate metal layer 281 formed of molybdenum containing at least one of oxygen, nitrogen and carbon, and a second gate metal layer 282 formed of aluminum. The storage electrode line 28 is overlapped with a storage capacitor conductive pattern 64 connected to a pixel electrode 82 (to be described later), and forms a storage capacitance to enhance an electrical potential of a pixel. In the case where the storage capacitance owing to the overlap of the pixel electrode 82 with the gate line 22 is sufficient, the storage electrode line 28 can be omitted. Generally, a voltage applied to the storage electrode line 28 is equal to the voltage applied to a common electrode of a top substrate.

On the gate line assembly 22, 24, 26 and the storage electrode line 28 is formed a gate insulating layer 30 formed of silicon nitride (SiNx) or the like to cover the gate line assembly 22, 24, 26 and the storage electrode line 28. On the gate insulating layer 30 are formed semiconductor patterns 42 and 48, which are formed of a semiconductor such as hydrogenated amorphous silicon or the like. On the semiconductor patterns 42 and 48 is formed an ohmic contact pattern or an intermediate layer pattern 55, 56, 58, which are formed of amorphous silicon or the like highly doped with n-type impurities such as phosphorous (P).

On the ohmic contact layer 55, 56 and 58 is formed a data line assembly 62, 64, 65, 66, 68 having a double-layered structure comprising a first data metal layer 621, 641, 651, 661, 681 and a second data metal layer 622, 642, 652, 662, 682. The first data metal layer 621, 641, 651, 661, 681 is formed of molybdenum containing at least one of oxygen, nitrogen and carbon, and the second data metal layer 622, 642, 652, 662, 682 is formed of an aluminum layer.

The data line assembly comprises a data line portion 62, 68, 65 containing a data line 62 extending in a vertical direction and having an end portion 68 to receive an external video signal and a source electrode 65 of the thin film transistor branched from the data line 62, a drain electrode 66 of the thin film transistor separated from the data line portion 62, 68, 65 and opposite to the source electrode 65 with respect to the gate electrode 26 or TFT portions E, and the storage capacitor conductive pattern 64 disposed on the storage electrode line 28. In the case where the storage electrode line 28 is not provided, the storage capacitor conductive pattern 64 can be omitted.

The ohmic contact patterns 55, 56, 58 lower the contact resistance between the underlying semiconductor patterns 42, 48 and the overlying data line assembly 62, 64, 65, 66, 68, and have the same shape as the data line assembly 62, 64, 65, 66, 68. That is, the data line intermediate layer pattern 55 has the same shape as the data lines 62, 68, 65; the drain electrode intermediate layer 56 has the same shape as the drain electrodes 66; and the storage capacitor conductive pattern intermediate layer 58 has the same shape as the storage capacitor conductive pattern 64.

The semiconductor patterns 42, 48 have the similar shape as the data line assembly 62, 64, 65, 66, 68 and the ohmic contact patterns 55, 56, 58 except for the TFT channel portions E. In more detail, the storage capacitor semiconductor pattern 48, the storage capacitor conductive pattern 64, and the storage capacitor ohmic contact pattern 58 have the similar shape to each other, but the TFT semiconductor pattern 42 differs in shape from the data line assembly and the other portions of the ohmic contact patterns. That is, the data line assembly 62, 68, 65 at the TFT channel portion E, particularly, the source electrode 65 and the drain electrode 66 are separated from each other, and the data line intermediate layer pattern 55 and the drain electrode ohmic contact pattern 56 are separated from each other. However, the TFT semiconductor pattern 42 continuously extends at the TFT channel portion E without separation, thereby forming the channel of the thin film transistor.

On the data line assembly 62, 64, 65, 66, 68 is formed a protective layer 70 formed of silicon nitride, a-Si:C:O or a-Si:O:F (low dielectric layer) deposited by PECVD, or an organic insulating layer. The protective layer 70 has contact holes 76, 78, 72 exposing the drain electrodes 66, the end portion 68 of the data line, and the storage capacitor conductive pattern 64, respectively. Further, the protective layer 70 has a contact hole 74 exposing the end portion 24 of the gate line together with the gate insulating layer 30.

On the protective layer 70 is formed a pixel electrode 82, which receives a video signal from the thin film transistors and generates an electric field together with an upper electrode (not shown). The pixel electrode 82 is formed of a transparent conductive material such as ITO, IZO or the like. The pixel electrode 82 is physically and electrically connected to the drain electrode 66 via the contact hole 76 to receive the video signal. Here, the pixel electrode 82 is overlapped with the neighboring gate line 22 and the neighboring data line 62 to enhance the aperture ratio. Alternatively, the pixel electrode 82 may not be overlapped with the neighboring gate line 22 and the neighboring data line 62. Further, the pixel electrode 82 is electrically connected to the storage capacitor conductive pattern 64 through the contact hole 72 to transmit the video signal thereto. Meanwhile, contact subsidiary parts 86, 88 are formed over the end portion 24 of the gate line and the end portion 68 of the data line, and connected to both the end portion 24 of the gate line and the end portion 68 of the data line through the contact holes 74, 78, respectively. The contact subsidiary parts 86, 88 enhance adhesion between the end portions 24, 68 and external circuits and protect the end portions 24, 68, respectively. Alternatively, the contact subsidiary parts 86, 88 can be omitted if not necessary.

Figure 13A:
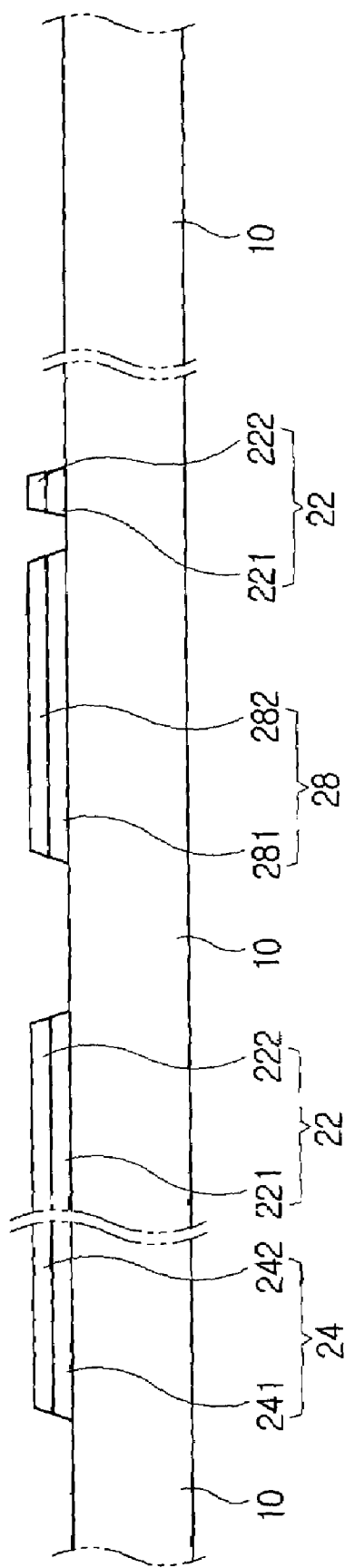

A method of fabricating the TFT array panel according to the second embodiment of the present invention is as follows. As shown in FIGS. 13A through 13B, the first gate metal layer 221, 241, 261, 281 formed of the molybdenum layer containing at least one of oxygen, nitrogen and carbon is deposited. Thereafter, the second gate metal layer 222, 242, 262, 282 formed of the aluminum layer is deposited and patterned by a photolithography process to form the gate line assembly including the gate line 22, the gate electrode 26 and the storage capacitor electrode 28. At this time, the width of one end portion 24 of the gate line 22 is enlarged to formed electrically contact with an external circuit.

Figure 14A:
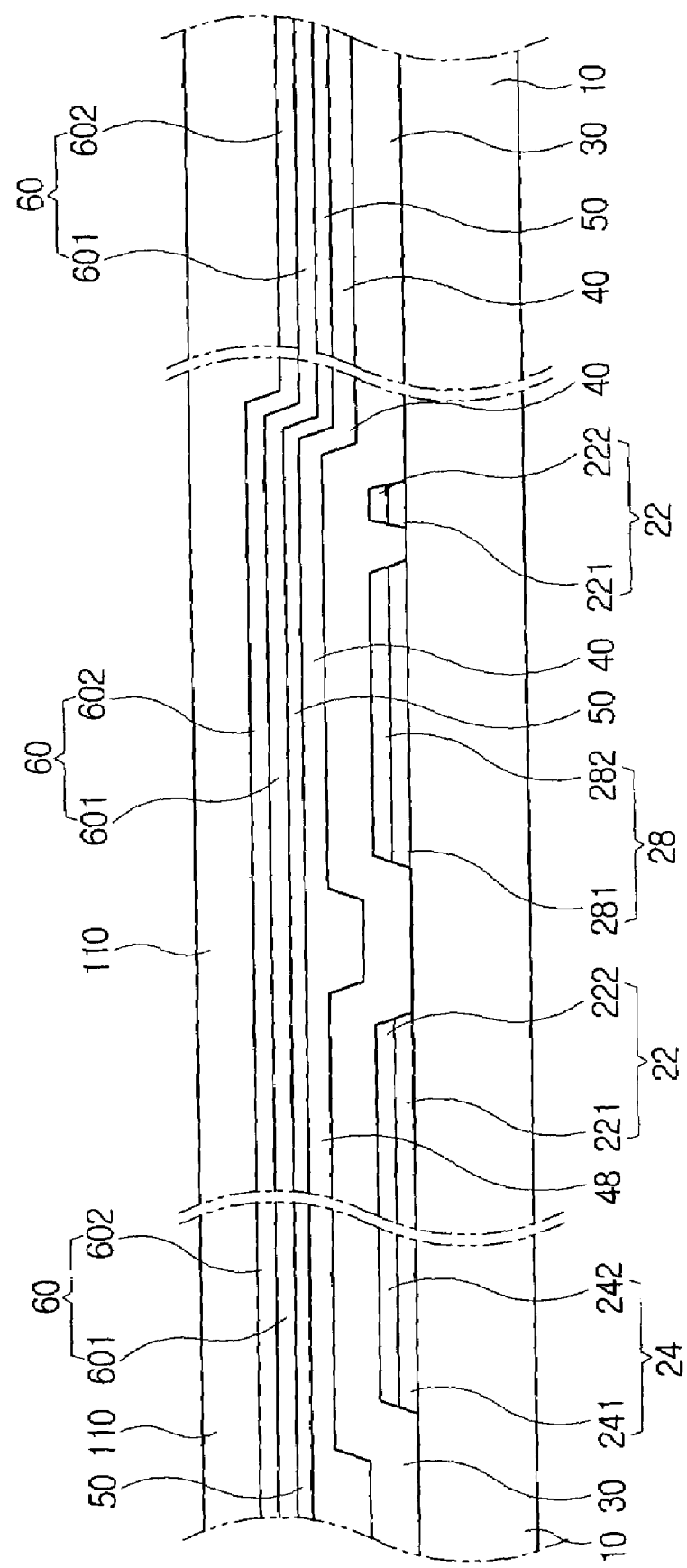
Figure 14B:
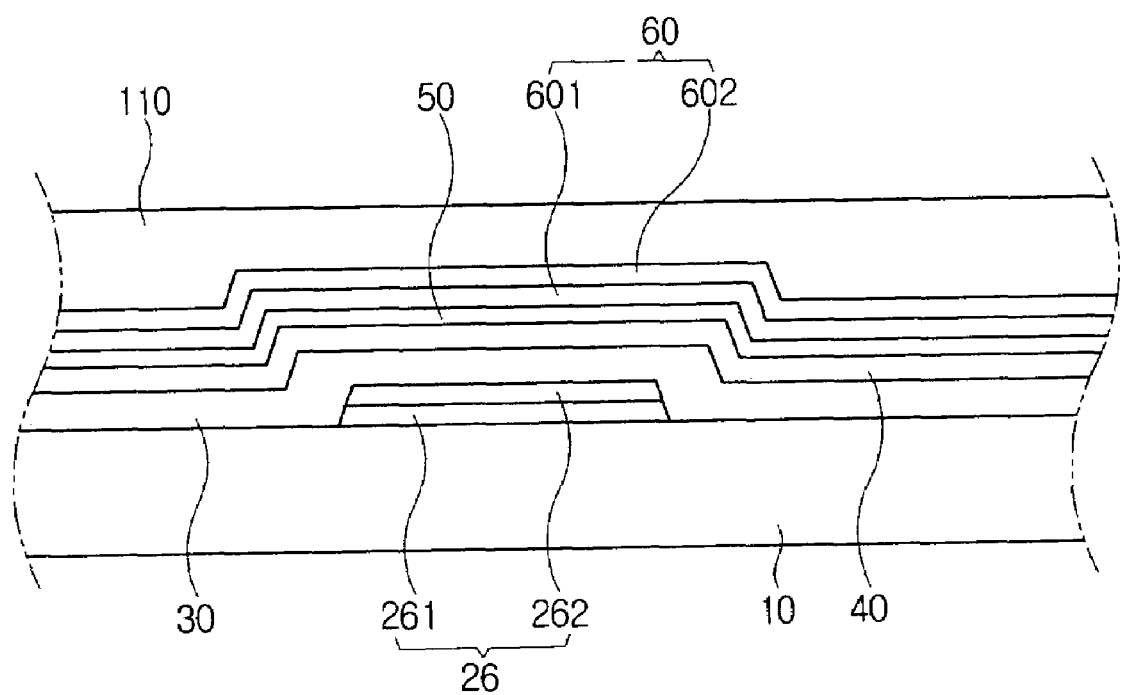

Thereafter, referring to FIGS. 14A and 14B, the gate insulating layer 30 having a thickness of about 1500 Å to about 5000 Å, the semiconductor layer 40 having a thickness of about 500 Å to about 2000 Å and the intermediate layer 50 having a thickness of about 300 Å to about 600 Å are sequentially deposited by CVD. The first conductive layer 601 formed of molybdenum containing at least one of oxygen, nitrogen and carbon is deposited to form the data line assembly. Then, the second conductive layer 602 formed of aluminum is deposited on the first conductive layer 601 by sputtering to form the conductive layer 60. Then, a photoresist film 110 having a thickness of about 1 μm to about 2 μm is formed on the conductive layer 60.

Figure 15A:
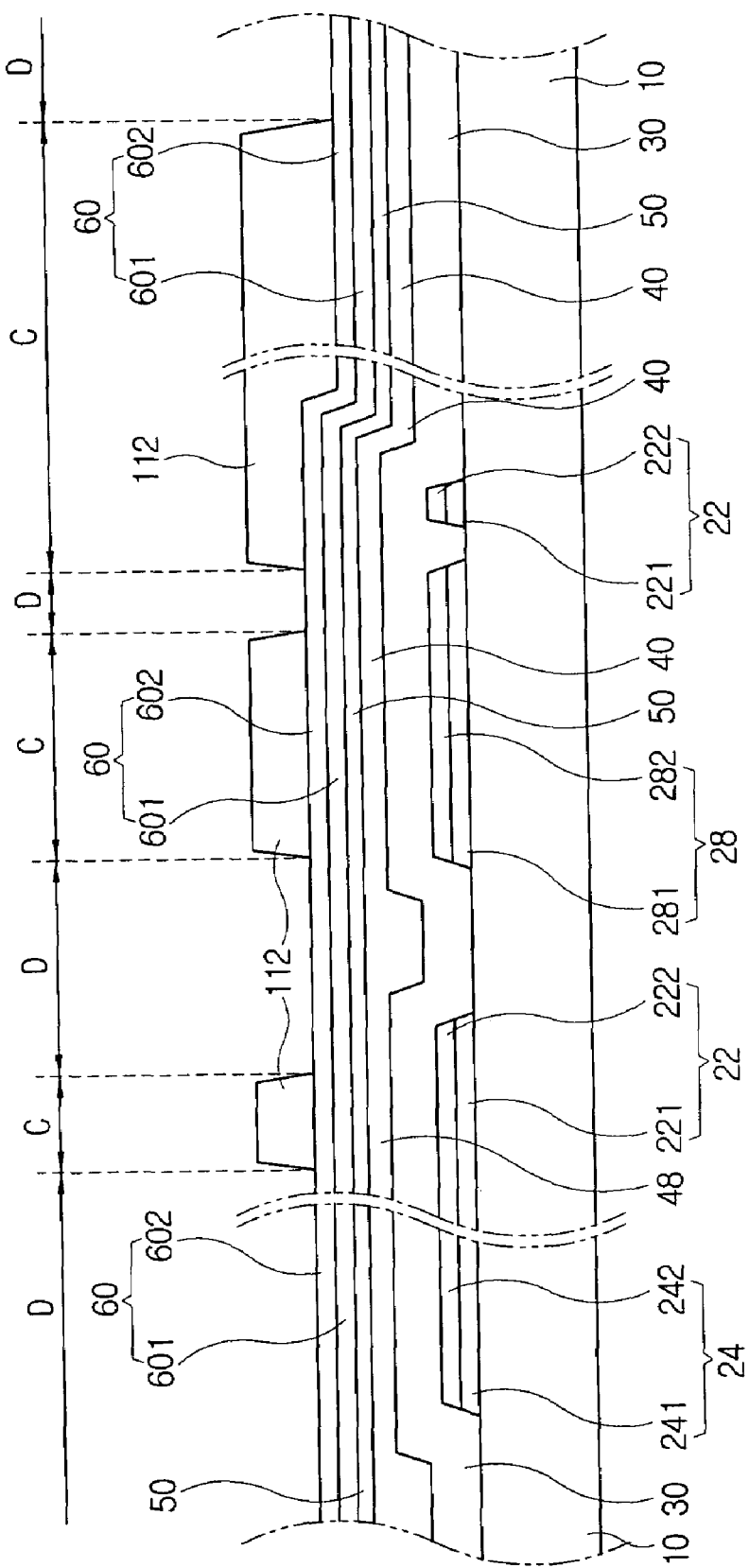
Figure 15B:
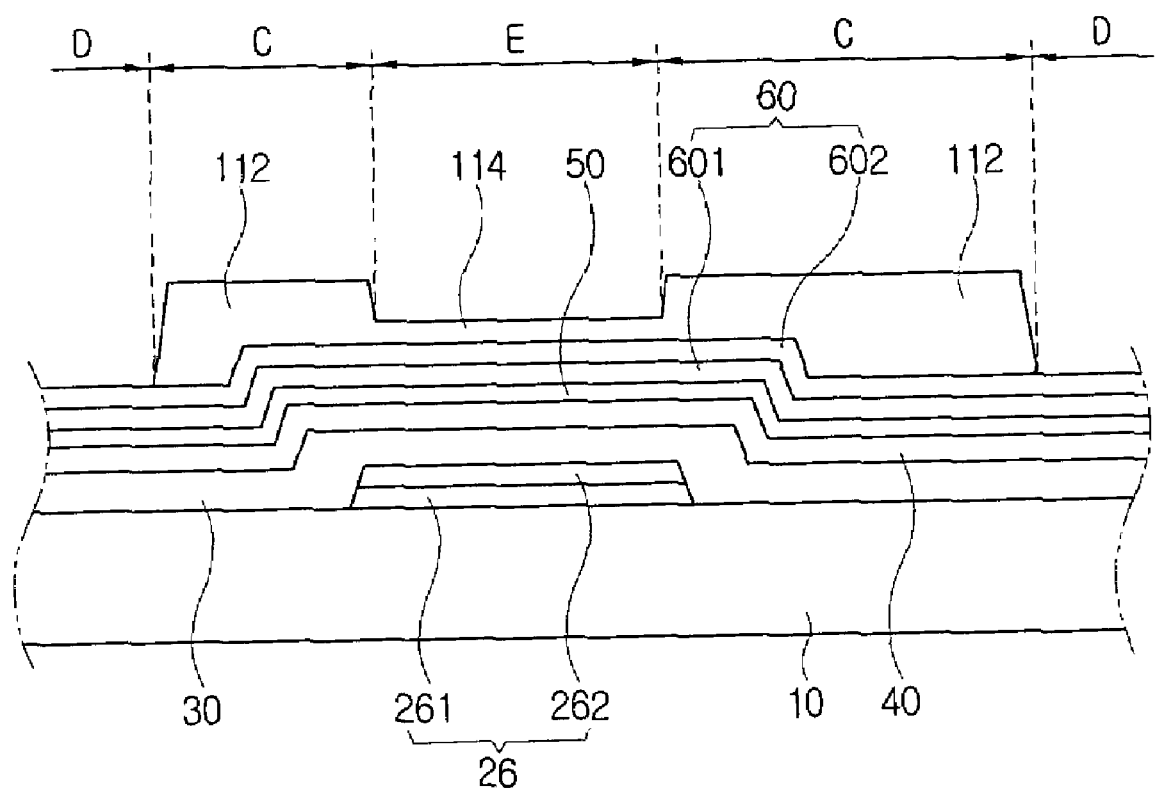

Referring to FIGS. 15A and 15B, the photoresist film 110 is exposed to a light through a mask and developed to form a photoresist pattern 112, 114. At this time, the first photoresist pattern portion 114 placed at the TFT channel portion E between the source and drain electrodes 65, 66 is established to have a thickness smaller than that of the second photoresist pattern portion 112 placed at a data line assembly portion C in which the data line assembly 62, 64, 65, 66, 68 will be formed. On the other hand, the photoresist pattern portion 110 placed at the portion D is all removed. The thickness ratio of the first photoresist pattern portion 114 placed at the TFT channel portion E to the second photoresist pattern portion 112 remaining at the data line assembly portion C is controlled depending upon the processing conditions in the subsequent etching process. For example, the thickness of the first photoresist pattern portion 114 is formed to be about ½ or less of that of the second photoresist pattern portion 112. Preferably, the thickness of the first photoresist pattern portion 114 can be formed to be about 4000 Å or less.

According to an embodiment of the present invention, various masks can be used to differentiate the thickness of the photoresist film 110. The masks may include a slit pattern, a lattice pattern or a semitransparent film to control light transmittance. In the case of using the slit pattern or the lattice pattern, it is preferable that the width of the slit or lattice should be smaller than the light decomposition capacitance of a light exposure apparatus. In the case of using the semitransparent film, the semitransparent film can have at least two thin films with different transmittances or thicknesses to adjust the transmittance while the mask is formed.

When the photoresist film is exposed to light through the mask, high molecules of the photoresist film 110 directly exposed to light are completely decomposed. Further, the high molecules of the photoresist film corresponding to the slit pattern or the semitransparent film of the mask are decomposed at some degree. However, the high molecules of the photoresist film blocked from the mask are not decomposed. When the photoresist film 110 after exposing to the light is developed, the portions where the high molecules are not decomposed remain at different thicknesses depending upon the degree of molecular decomposition. At this time, the light exposing time should be not long to prevent all the molecules of the photoresist film from being decomposed. Alternatively, the first photoresist pattern portion 114 having a relatively small thickness can be formed using a photoresist film capable of reflow. The photoresist film is exposed to light through a usual mask with a light transmission portion and a light interception portion. Then, the light-exposed photoresist film is developed and reflows such that the film portion is partially flown to the non-film area, in order to form a thin photoresist pattern 114.

Thereafter, the first photoresist pattern portion 114 and its underlying layers thereof, which are, the conductive layer 60, the intermediate layer 50, and the semiconductor layer 40, are etched. The data line and its underlying layers remain at the data line assembly portion C, and only the semiconductor layer 40 remain at the TFT channel portion E. Further, the conductive layer 60, the intermediate layer 50, and the semiconductor layer 40 are all removed at the other portion D to expose the underlying gate insulating layer 30.

First, referring to FIGS. 14A and 14B, the conductive layer 60 exposed at the other portion D is removed, thereby exposing the underlying intermediate layer 50. According to an embodiment of the present invention, either dry or wet etching can be used for etching the conductive layer 60. Both etching methods are preferably performed under the conditions that the photoresist pattern portions 112, 114 are not etched while the conductive layer 60 is etched. However, in drying etching, it is difficult to find proper conditions to avoid etching the photoresist pattern portions 112, 114. Thus, drying etching is performed under the conditions that both the conductive layer 60 and the photoresist pattern portions 112, 114 are etched. In drying etching, the first photoresist pattern portion 114 is formed thick as compared with that in wet etching in order to prevent the underlying conductive layer 60 from being exposed.

Figure 16A:
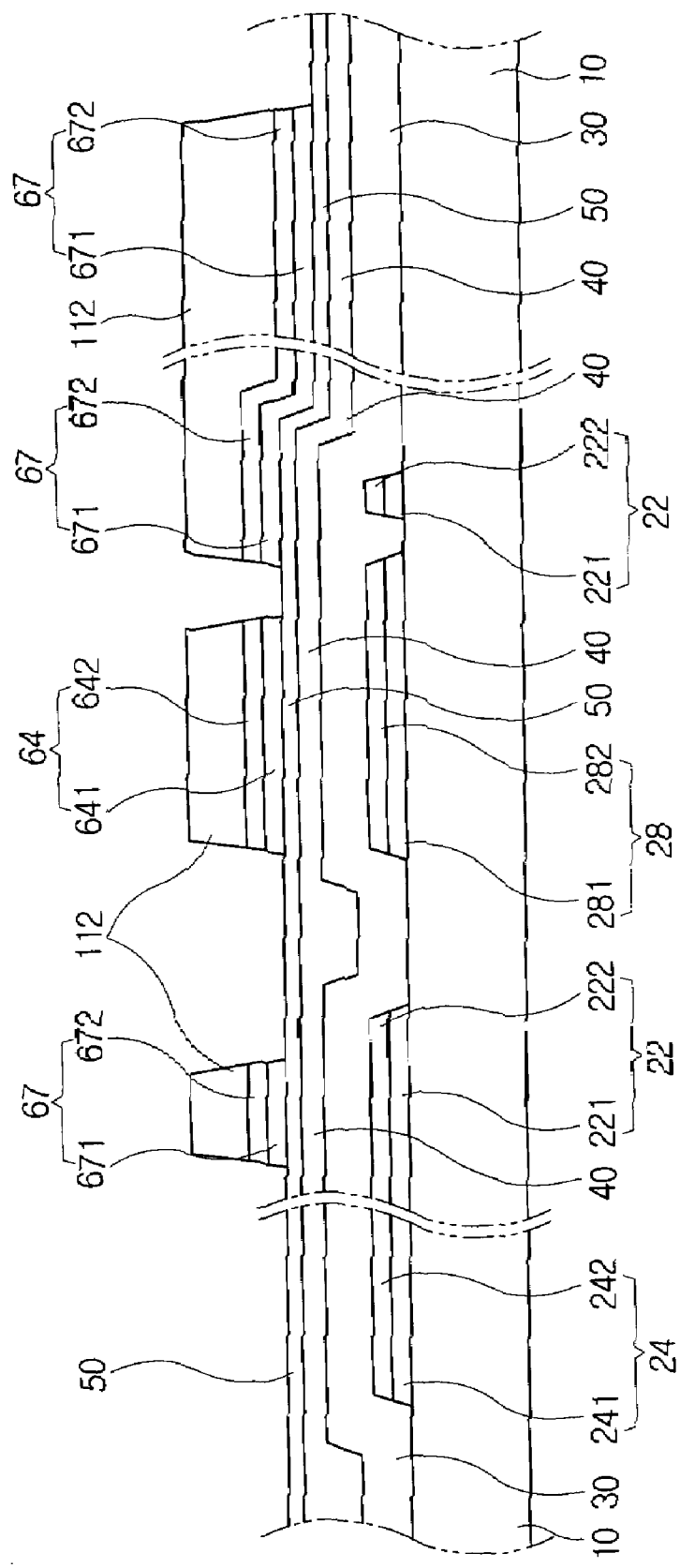
Figure 16B:
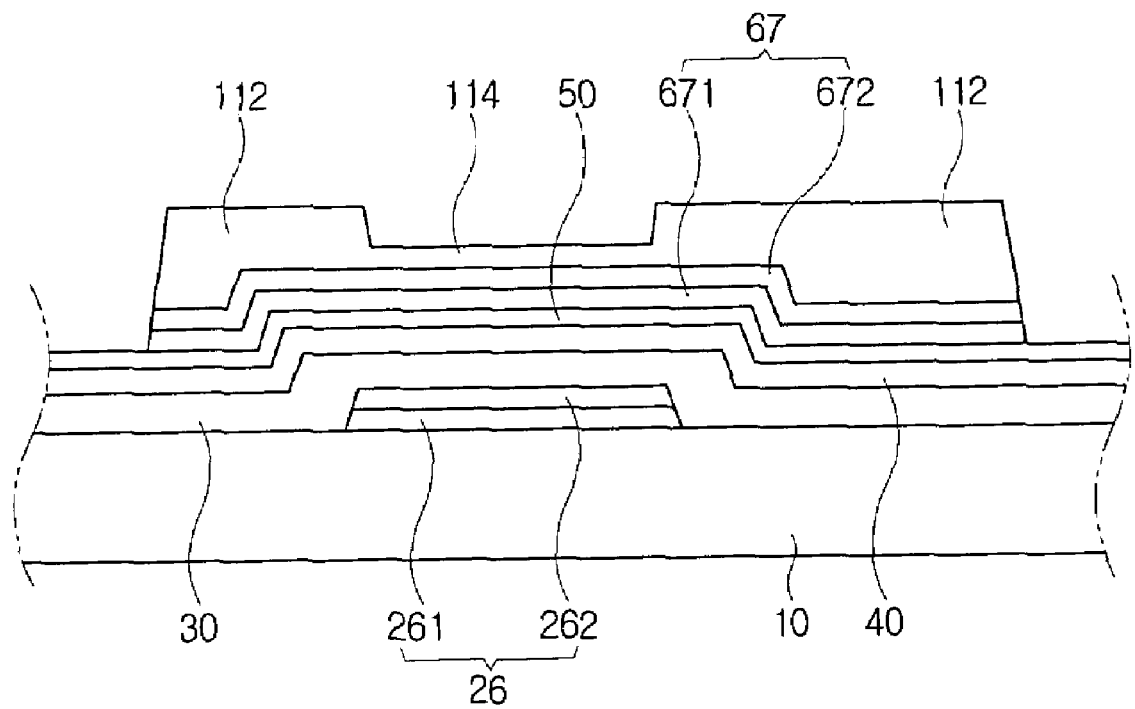

Consequently, as shown in FIGS. 16A and 16B, the conductive layer at the channel area E and the data line assembly area C is patterned, which means that the source/drain conductive pattern 67 and the storage capacitor conductive pattern 64 remain, whereas the conductive layer 60 placed at the portion D is all removed, thereby exposing the underlying intermediate layer 50. At this time, the remaining conductive patterns 67, 64 have a similar shape as the data line assembly 62, 64, 65, 66, 68 except that source and drain electrodes 65 and 66 are not yet separated from each other and still connected to each other. Furthermore, in dry etching, the photoresist pattern portions 112 and 114 are also removed at some degree.

Figure 17A:
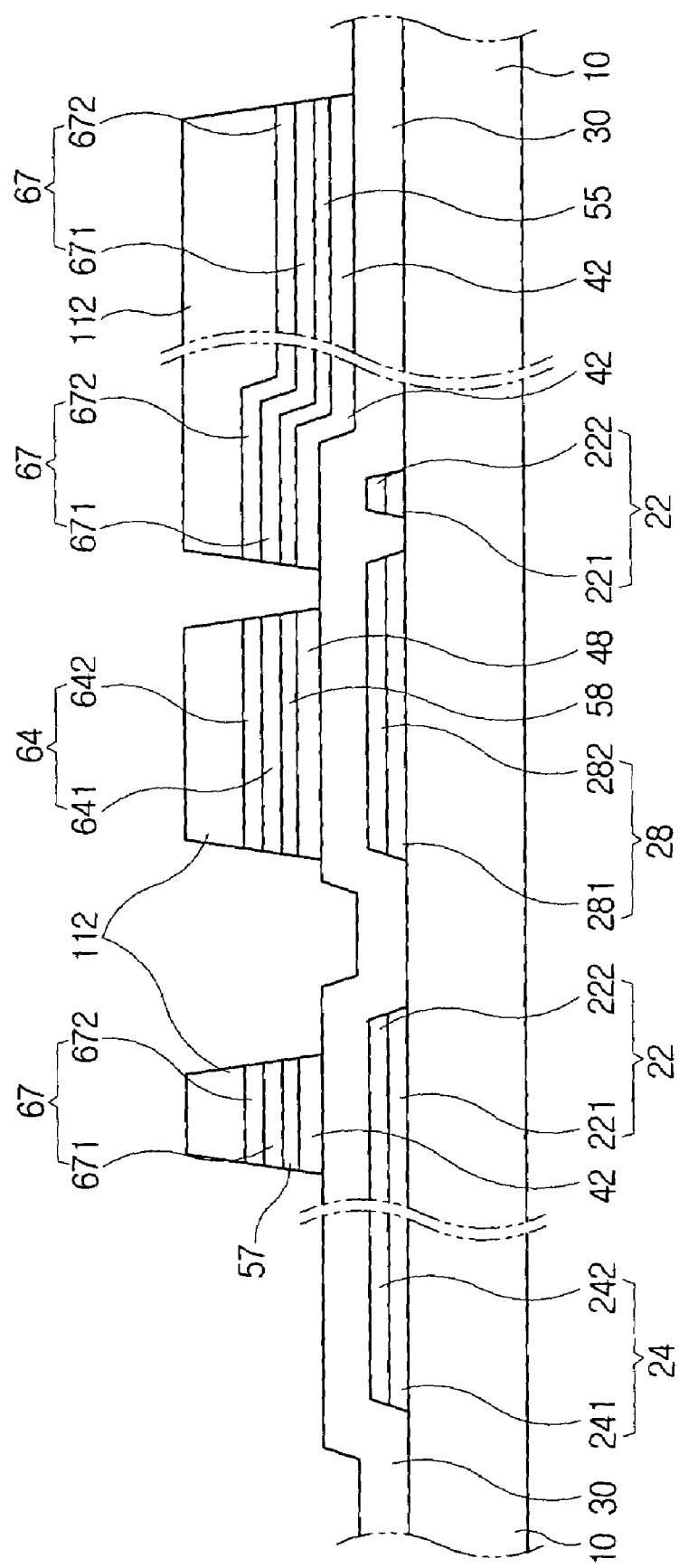
Figure 17B:
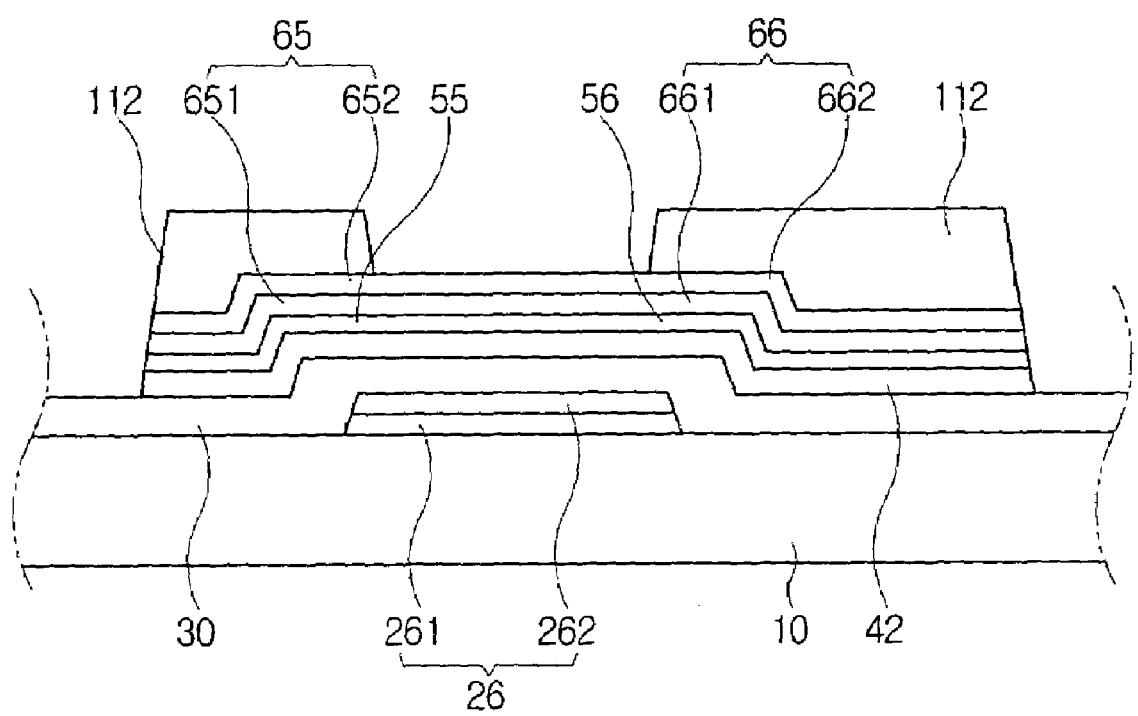

Referring to FIGS. 17A and 17B, the intermediate layer 50 exposed at the portion D and the underlying semiconductor layer 40, together with the first photoresist pattern portion 114, are simultaneously removed by dry etching. The dry etching is performed under the conditions that the photoresist pattern portions 112 and 114, the intermediate layer 50, and the semiconductor layer 40 (the semiconductor layer and the intermediate layer having no etching selectivity) are simultaneously etched, whereas the gate insulating layer 30 is not etched. Particularly, the dry etching is preferably performed under the conditions that the etching rates with respect to the photoresist patterns 112 and 114 and the semiconductor layer 40 are approximately similar to each other. For example, mixture gas of $SF_6$ and HCl, or $SF_6$ and $O_2$ is used to etch the photoresist pattern 112 (or 114) and the semiconductor layer 40 by substantially the same thickness. When the etching rates of the photoresist patterns 112 and 114 and the semiconductor layer 40 are the same or substantially the same, the thickness of the first photoresist pattern 114 is preferably the same as or less than the sum thickness of the semiconductor layer 40 and the intermediate layer 50.

Consequently, as shown in FIGS. 17A and 17B, the first photoresist pattern portion 114 at the channel portion E is removed, and the source/drain conductive pattern 67 is exposed. The intermediate layer 50 and the semiconductor layer 40 at the portion D area are removed, and the underlying gate insulating layer 30 is exposed. Meanwhile, the second photoresist pattern portion 112 at the data line assembly portion C is also etched, so that the thickness thereof becomes smaller. Further, in this process, the semiconductor patterns 42 and 48 are formed. Reference numeral 57 and 58 indicate the intermediate pattern under the source/drain conductive pattern 67 and the intermediate pattern under the storage capacitor conductive pattern 64, respectively. Then, the photoresist residue on the source/drain conductive pattern 67 at the channel portion E is removed through ashing.

Figure 18A:
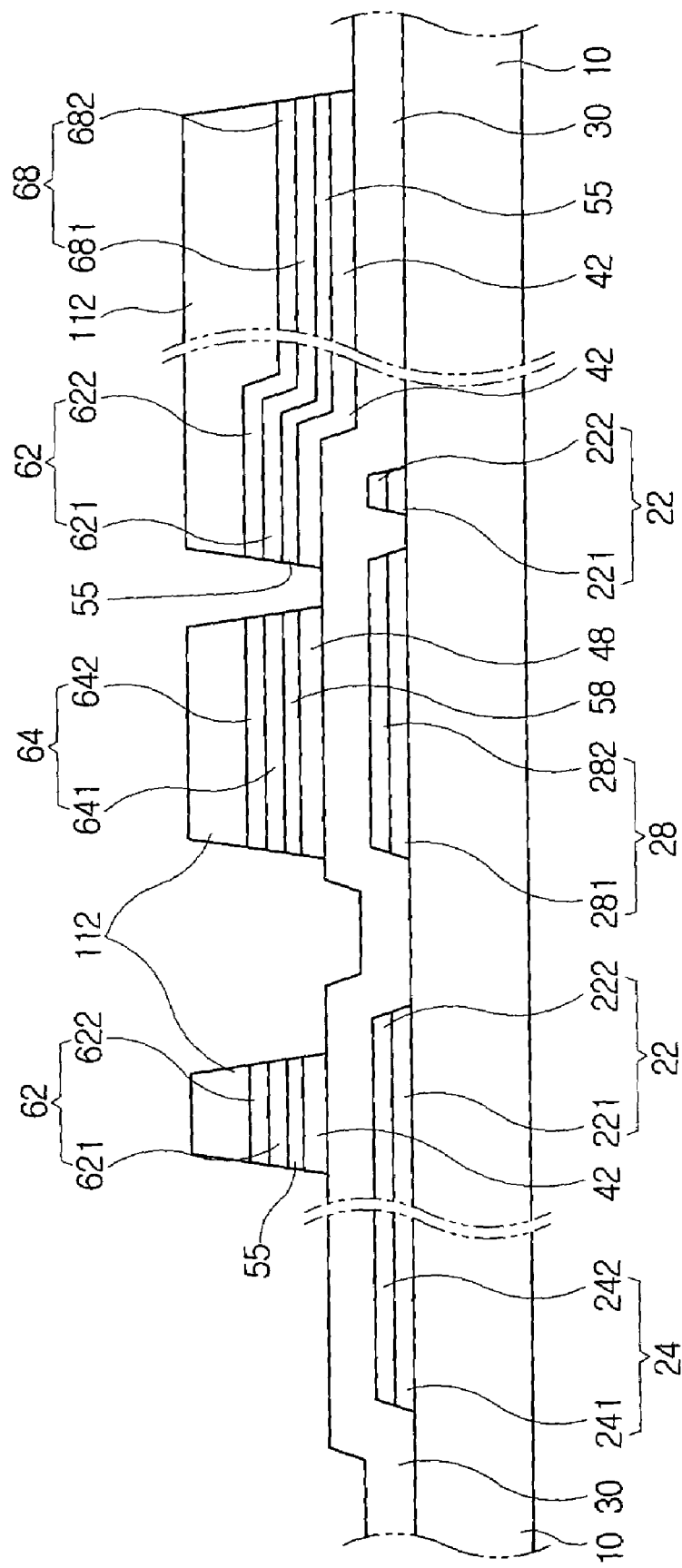
Figure 18B:
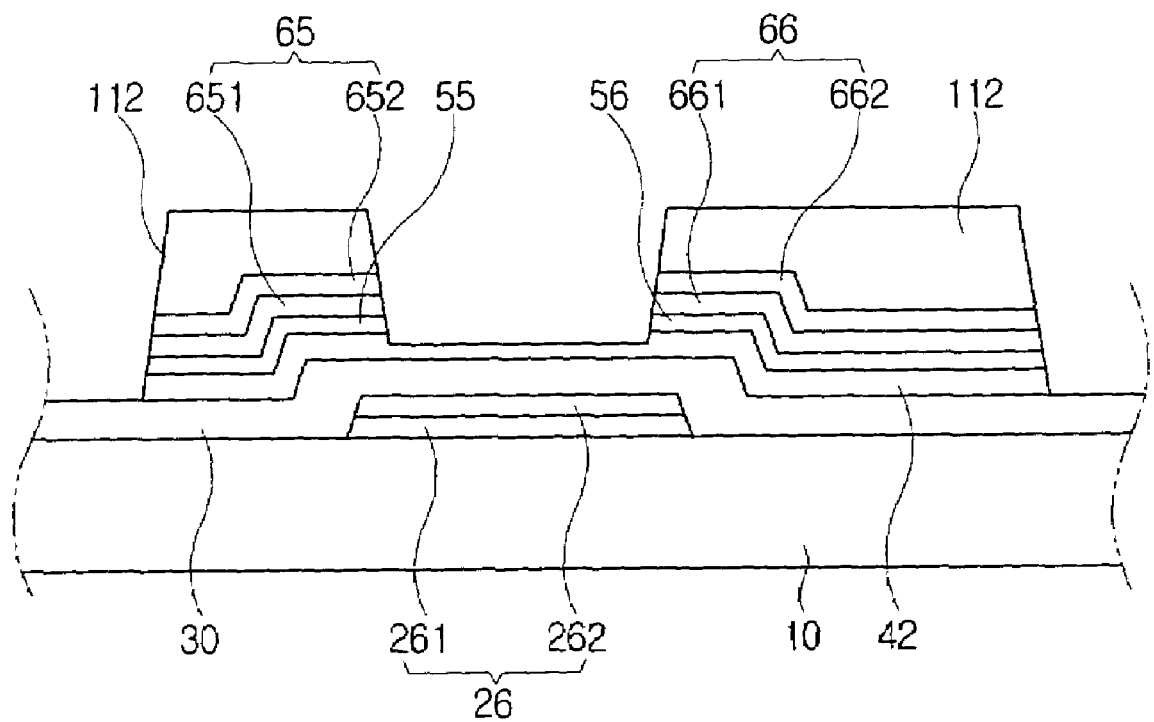

Thereafter, referring to FIGS. 18A and 18B, the source/drain conductive pattern 67 and the source/drain intermediate layer pattern 57 at the channel portion E area are etched and removed. According to an embodiment of the present invention, dry etching is performed to both the source/drain conductive pattern 67 and the source/drain intermediate layer pattern 57. Alternatively, wet etching can be performed to the source/drain conductive pattern 67, and dry etching can be applied to the source/drain intermediate layer pattern 57. In the former case, it is preferable that the etching selectivity of the source/drain conductive pattern 67 to the source/drain intermediate layer pattern 57 is high. If the etching selectivity is not high, it is difficult to find the end point of the etching process and to control the thickness of the semiconductor pattern 42 remaining at the channel portion E. In the latter case, that is, when wet etching and dry etching are alternated, the lateral sides of the source/drain conductive pattern 67 are etched by wet etching but the lateral sides of the source/drain intermediate layer pattern 57 may not be substantially etched by dry etching, thereby forming a cascade structure.

In the meanwhile, mixture gas of $CF_4$ and HCl, or $CF_4$ and $O_2$ can be preferably used for etching the intermediate layer pattern 57 and the semiconductor pattern 42. When the mixture gas of $CF_4$ and $O_2$ is used, the semiconductor pattern 42 can have a uniform thickness. At this time, as shown in FIG. 18B, the semiconductor pattern 42 can be partially removed and becomes thinner, and the second photoresist pattern portions 112 is also etched by a predetermined thickness. The etching should be performed under the conditions to prevent the gate insulating layer 30 from being etched. It is preferable that the thickness of the second photoresist pattern 112 is sufficiently larger to prevent the underlying data line assembly 62, 64, 65, 66, 68 from being exposed when etched. In result, the source electrodes 65 and the drain electrodes 66 are separated from each other, thereby completing the data line assembly 62, 64, 65, 66, 68 and the underlying ohmic contact patterns 55, 56, 58.

Finally, the second photoresist pattern portion 112 remained at the data line assembly area C is removed. Alternatively, the second photoresist pattern portion 112 can be removed before removing the underlying intermediate layer pattern 57 after removing the source/drain conductive pattern 67 at the channel portion E. As described above, wet etching and dry etching can be alternately used, or only dry etching can be used. In the latter case, the process is simple but it is relatively difficult to find proper etching conditions. Contrary, in the former case, it is relatively easy to find the proper etching conditions, but the process is complicated.

Figure 19A:
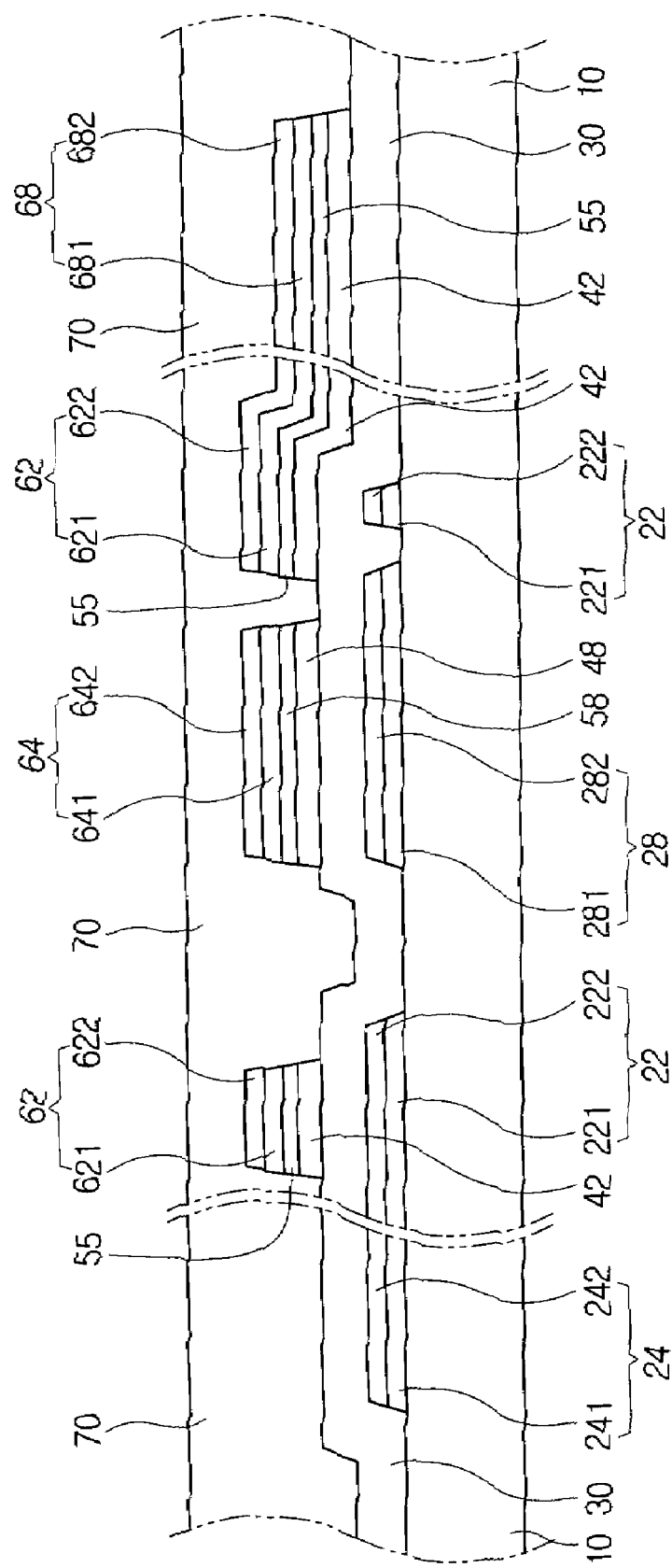
Figure 19B:
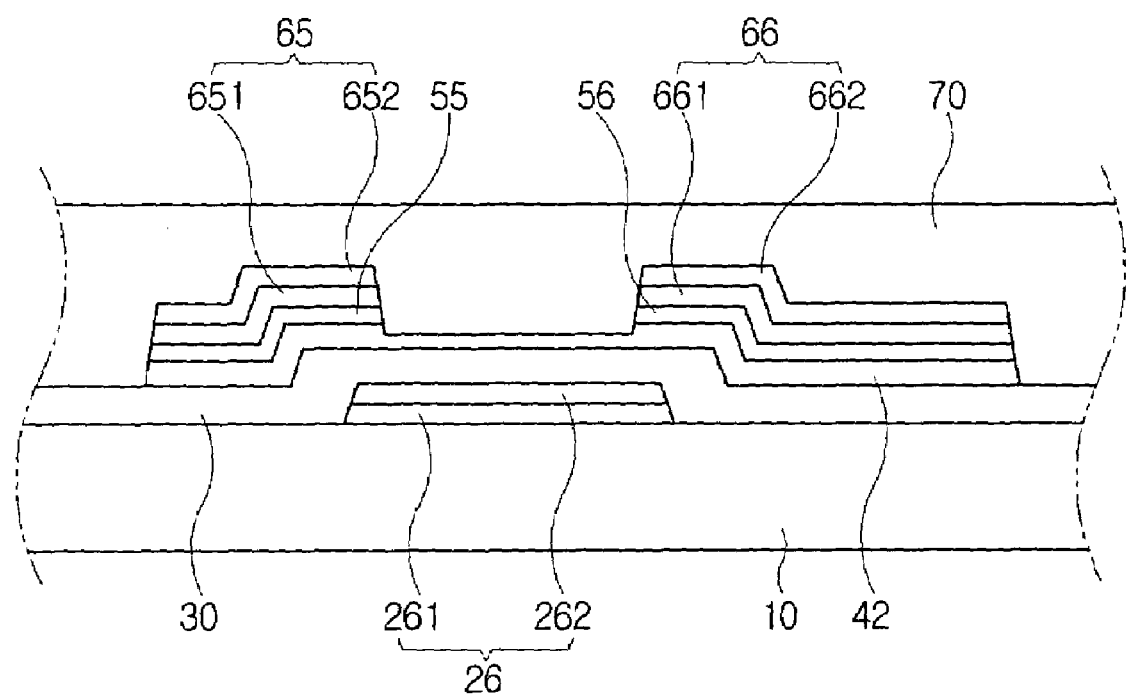
Figure 20A:
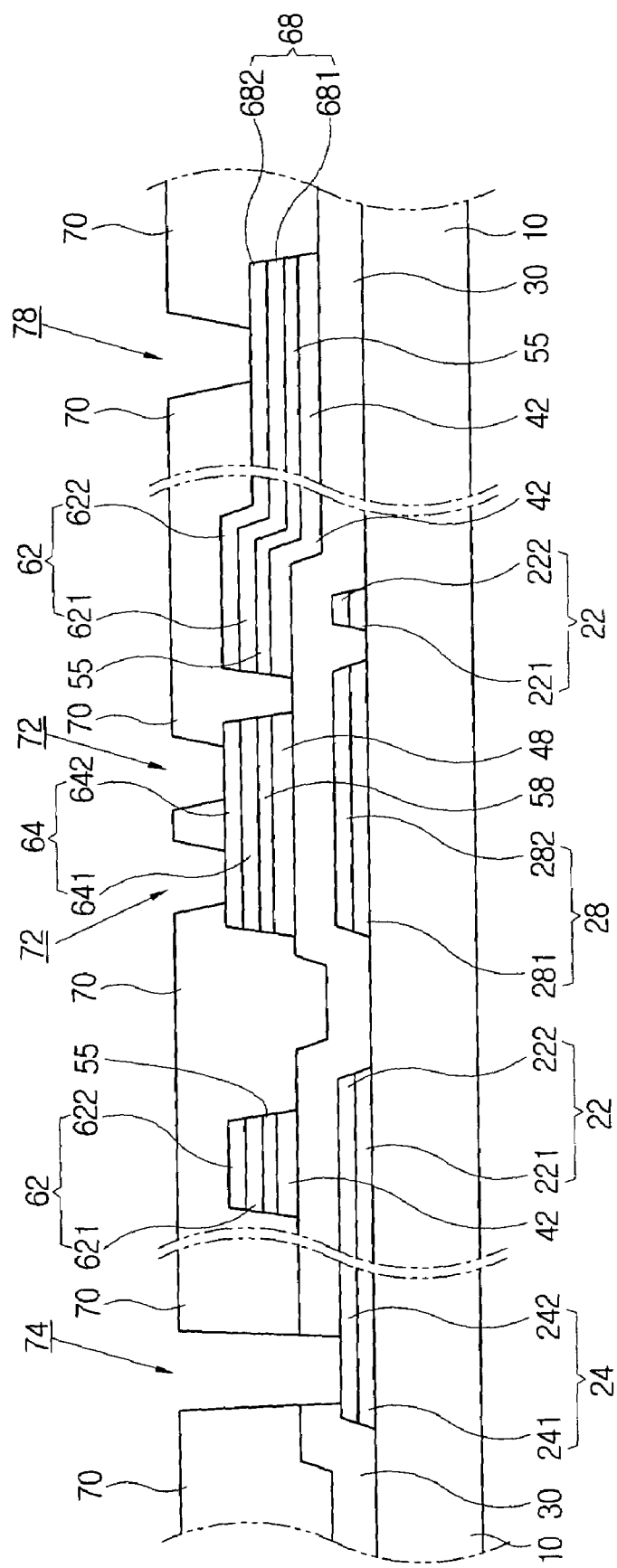
Figure 20B:
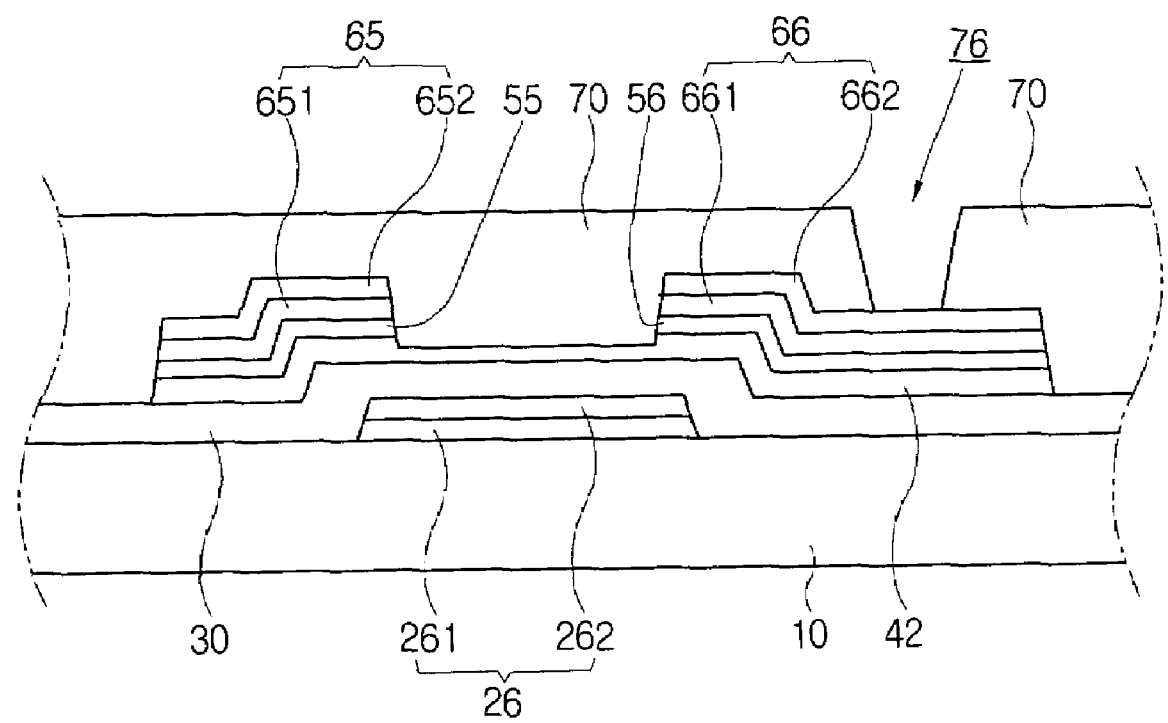

As shown in FIGS. 19A to 19B, the protective layer 70 is formed by growing silicon nitride, a-Si:C:O or a-Si:O:F through the CVD method, or applying an organic insulating film. Referring to FIGS. 20A and 20B, the protective layer 70, together with the gate insulating layer 30, is etched to form contact holes 76, 74, 78, 72 through which the drain electrodes 66, the end portion 24 of the gate line, the end portion 68 of the data line, and the storage capacitor conductive pattern 64 are exposed, respectively.

Finally, referring to FIGS. 11 and 12, the ITO layer or the IZO layer having a thickness of about 400 Å to about 500 Å is deposited and etched to form the pixel electrode 82 connected to the drain electrode 66 and the storage capacitor conductive pattern 64, and to form the contact subsidiary data part 88 connected to the end portion 24 of the gate line, the contact subsidiary gate part 86, and the end portion 68 of the data line. Meanwhile, nitrogen gas can be used in a preheating process prior to depositing the ITO or IZO layer. The nitrogen gas prevents oxidation of the metal layer 24, 64, 66, 68 exposed through the contact holes 72, 74, 76, 78 respectively.

According to the second embodiment of the present invention, the data line assembly 62, 64, 65, 66, 68, the underlying ohmic contact patterns 55, 56, 58 and the semiconductor patterns 42 and 48 are etched using one mask, and at the same time, the source and drain electrodes 65 and 66 are separated from each other, thereby simplifying the fabricating process.

According to the second embodiment of the present invention, the gate line assembly 22, 24, 26, the storage electrode line 28, and the data line assembly 62, 64, 65, 66, 68 all have the double-layered structure, but some thereof may have the double-layered structure as necessary. Further, some or all of the second embodiment of the present invention, the gate line assembly 22, 24, 26, the storage electrode line 28, and the data line assembly 62, 64, 65, 66, 68 may have the triple-layered structure. Also, the present invention of the second embodiment may not be applied to all of the gate line assembly 22, 24, 26, the storage electrode line 28, and the data line assembly 62, 64, 65, 66, 68.

As described above, the present invention provides a method of fabricating aluminum wiring lines on a TFT array panel, in which a hillock is prevented from growing. Also the present invention can be used not only in TFT LCD but also in OLED (organic light emitting diode).

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A thin film transistor (TFT) array panel for a display device comprising:
    a molybdenum layer formed on a substrate and containing at least one impurity selected from a group consisting of oxygen, nitrogen and carbon;
    an aluminum layer formed on the molybdenum layer; the aluminum layer having a preferred orientation of (111); and
    a metal layer formed on the aluminum layer, the metal layer being a pure metal.

2. The TFT array panel according to claim 1, wherein the molybdenum layer has a face-centered cubic lattice structure and has a preferred orientation of (111).

3. The TFT array panel according to claim 1, wherein the molybdenum layer contains the impurity by 0.01 to 30 atom %.

* * * * *